(12) United States Patent
Nomura et al.

(10) Patent No.: US 7,732,061 B2
(45) Date of Patent: Jun. 8, 2010

(54) LIGHT EMITTING ELEMENT AND LIGHT EMITTING DEVICE HAVING THE LIGHT EMITTING ELEMENT

(75) Inventors: Ryoji Nomura, Kanagawa (JP); Harue Nakashima, Kanagawa (JP); Satoko Shitagaki, Kanagawa (JP); Hisao Ikeda, Kanagawa (JP); Junichiro Sakata, Kanagawa (JP); Satoshi Seo, Kanagawa (JP); Daisuke Kumaki, Niigata (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 771 days.

(21) Appl. No.: 10/590,568
(22) PCT Filed: Nov. 28, 2005
(86) PCT No.: PCT/JP2005/022224
§ 371 (c)(1),
(2), (4) Date: Aug. 22, 2006
(87) PCT Pub. No.: WO2006/059734

PCT Pub. Date: Jun. 8, 2006

(65) Prior Publication Data
US 2007/0194692 A1   Aug. 23, 2007

(30) Foreign Application Priority Data
Nov. 30, 2004   (JP)   ............................... 2004-347688

(51) Int. Cl.
H01L 51/54 (2006.01)
H01J 1/63 (2006.01)

(52) U.S. Cl. ..................... 428/690; 428/917; 313/504; 313/506

(58) Field of Classification Search ........................ None
See application file for complete search history.

(56) References Cited

U.S. PATENT DOCUMENTS 5,518,824 A * 5/1996 Funhoff et al. .............. 428/690

(Continued)

FOREIGN PATENT DOCUMENTS

JP     07-157473     6/1995

(Continued)

OTHER PUBLICATIONS

International Search Report re application No. PCT/JP2005/022224, dated Mar. 14, 2006.

(Continued)

*Primary Examiner*—Dawn Garrett
(74) *Attorney, Agent, or Firm*—Husch Blackwell Sanders LLP

(57) ABSTRACT

It is an object to provide a light emitting element that has a different structure from that of a conventional light emitting element and includes a substance having a novel structure. It is also an object to provide a light emitting device having the light emitting element. In the view of the objects described above, the present invention provides a light emitting element including a layer containing a triazine derivative represented by the general formula (1) and a metal oxide that is an inorganic compound, provided between a pair of electrodes. Further, the present invention provides a light emitting device that has the light emitting element.

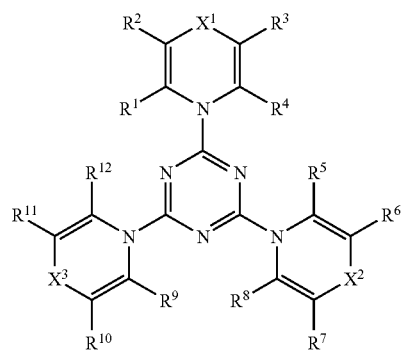

8 Claims, 8 Drawing Sheets

U.S. PATENT DOCUMENTS

| | | | |
|---|---|---|---|
| 5,716,722 A | 2/1998 | Hamada et al. | 428/690 |
| 6,720,090 B2 * | 4/2004 | Young et al. | 428/690 |
| 7,015,324 B2 | 3/2006 | Nomura et al. | 544/198 |
| 7,169,482 B2 * | 1/2007 | Aziz et al. | 428/690 |
| 2005/0225236 A1 | 10/2005 | Nomura et al. | 313/504 |

FOREIGN PATENT DOCUMENTS

| | | |
|---|---|---|
| JP | 08-199163 | 8/1996 |
| JP | 2005-306862 | 11/2005 |

OTHER PUBLICATIONS

Written Opinion of the International Searching Authority re application No. PCT/JP2005/022224, dated Mar. 14, 2006.

* cited by examiner

LIGHT EMITTING ELEMENT AND LIGHT EMITTING DEVICE HAVING THE LIGHT EMITTING ELEMENT

TECHNICAL FIELD

The present invention relates to a structure of a light emitting element including a triazine derivative, and also relates to a light emitting device having the light emitting element.

BACKGROUND ART

Many of light emitting elements that are used in displays and the like have a structure in which a layer containing a luminescent material is sandwiched between a pair of electrodes. In these light emitting elements, light is emitted when an exciton formed by recombination of an electron injected from one of the electrodes and a hole injected from the other electrode returns to the ground state.

In the field of light emitting elements, the structure of a layer containing a luminescent material, a novel material for forming a layer containing a luminescent material, and the like have been developed in order to obtain a light emitting element that is superior in luminous efficiency and chromaticity or is able to prevent quenching or the like.

For example, for the structure of a layer containing a luminescent material, a multilayer structure composed of a combination of a layer containing a highly carrier injecting substance, a layer containing a highly carrier transporting substance, and the like is proposed so that a light emitting region is formed in a region away from an electrode. Further, as for a highly carrier transporting substance, for example, a triazine derivative disclosed in Patent document 1 or Patent document 2 is proposed.

[Patent document 1] Japanese Patent Application Laid-Open No. H7-157473
[Patent document 2] Japanese Patent Application Laid-Open No. H8-1199163

DISCLOSURE OF INVENTION

In view of the circumstances described above, it is an object of the present invention to provide a light emitting device having a luminescence property.

In view of the object described above, the present invention has a feature of a light emitting element including a pair of electrodes, and a layer containing a triazine derivative represented by a general formula (1) and a metal oxide that is an inorganic compound which are provided between the pair of electrodes.

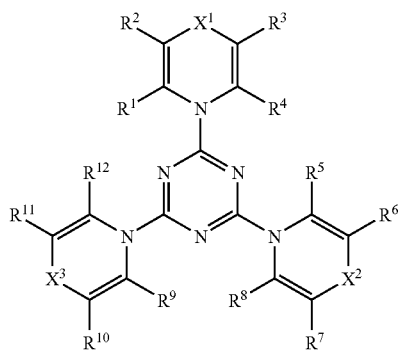

(1)

In the general formula (1), $R^1$ to $R^{12}$ are individually independent, or any one of $R^1$ and $R^2$, $R^3$ and $R^4$, $R^5$ and $R^6$, $R^7$ and $R^8$, $R^9$ and $R^{10}$, and $R^{11}$ and $R^{12}$ is bonded to form a ring. Here, when $R^1$ to $R^{12}$ are individually independent, $R^1$ to $R^{12}$ are individually any one of hydrogen, an alkyl group having 1 to 6 carbon atoms, an alkoxy group having 1 to 6 carbon atoms, a halogen group, an acyl group having 1 to 6 carbon atoms, an alkoxycarbonyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 14 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative.

Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In addition, when $R^1$ and $R^2$, $R^3$ and $R^4$, $R^5$ and $R^6$, $R^7$ and $R^8$, $R^9$ and $R^{10}$, and $R^{11}$ and $R^{12}$ are individually bonded to form rings, those rings are individually any one of an aromatic ring, a heterocycle, and an alicycle. In this case, the bond of $R^1$ and $R^2$, the bond of $R^3$ and $R^4$, the bond of $R^5$ and $R^6$, the bond of $R^7$ and $R^8$, the bond of $R^9$ and $R^{10}$, and the bond of $R^{11}$ and $R^{12}$ are individually independent. For example, $R^1$ and $R^2$ may be bonded to form any one of an aromatic ring, a heterocycle, and an alicycle, and then, $R^3$ to $R^{12}$ may be individually hydrogen or a substitutent. In addition, the aromatic ring may be condensed with another aromatic ring. The aromatic ring, the heterocycle, and the alicycle may individually have a substitutent such as an oxo group and an alkyl group having 1 to 6 carbon atoms. It is to be noted that the alkyl group includes an aliphatic heterocyclic group in the present invention. However, it is preferable to use a chain alkyl group since handling of the triazine derivative is easy.

In the general formula (1), $X^1$, $X^2$, and $X^3$ individually represent any one group of formulas (2) to (7).

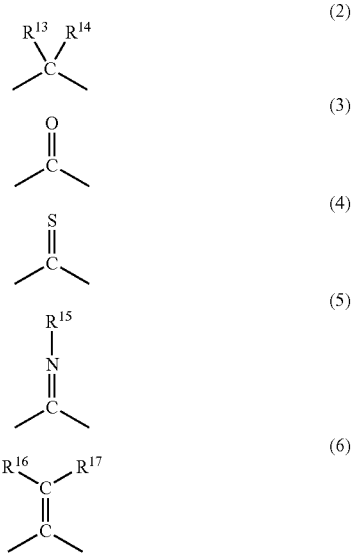

-continued

(7)

In the group represented by the formula (2), $R^{13}$ and $R^{14}$ may be individually independent, or bonded to form a ring. When $R^{13}$ and $R^{14}$ are individually independent, $R^{13}$ and $R^{14}$ are individually any one of hydrogen, an alkyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 10 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative. In addition, the aryl group and the heteroaromatic group may individually have a substitutent. Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

Alternatively, when $R^{13}$ and $R^{14}$ are bonded to form a ring, the ring is an alicycle having 3 to 10 carbon atoms (preferably, 6 carbon atoms). Preferable number of carbon atoms in the alicycle is determined in consideration of a raw material and easiness of handling of the triazine derivative. When the number of carbon atoms in the alicycle is much increased, the melting point (Tg) of the compound may be greatly decreased, and it may be thus difficult to handle the compound.

In the group represented by the formula (5), $R^{15}$ is any one of hydrogen, an aryl group having 6 to 30 carbon atoms (preferably, 6 to 14 carbon atoms), and a heteroaromatic group (heteroaryl group) having 2 to 18 carbon atoms (preferably, 2 to 10 carbon atoms). The preferable number of carbon atoms in the aryl group and the heteroaromatic group is determined in consideration of a raw material and easiness of handling of the triazine derivative. Here, the aryl group may have one or more substitutents such as an alkyl group having 1 to 6 carbon atoms, an acyl group having 1 to 6 carbon atoms, a halogen group, and an oxo group, or may be unsubstituted. It is to be noted that the alkyl group includes an aliphatic heterocyclic group in the present invention. However, it is preferable to use a chain alkyl group since handling of the triazine derivative is easy. It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In the group represented by the formula (6), $R^{16}$ and $R^{17}$ are individually independent, and any one of hydrogen, an aryl group having 6 to 30 carbon atoms, a heteroaromatic group (heteroaryl group) having 2 to 18 carbon atoms (preferably, 2 to 10 carbon atoms), and a cyano group. Preferable number of carbon atoms in the heteroaromatic group is determined in consideration of a raw material and easiness of handling of the triazine derivative. Here, the aryl group may have one or more substitutents such as an alkyl group having 1 to 6 carbon atoms, a halogen group, and an aryl group having 6 to 30 carbon atoms (preferably, 6 to 14 carbon atoms), or may be unsubstituted. It is to be noted that the alkyl group includes an aliphatic heterocyclic group in the present invention. However, it is preferable to use a chain alkyl group since handling of the triazine derivative is easy. The preferable number of carbon atoms in the aryl group is determined in consideration of a raw material and easiness of handling of the triazine derivative. It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In the a group represented by the formula (7), $R^{18}$ is any one of hydrogen, an alkyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 10 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative. Here, the aryl group may have a substitutent such as a dialkylamino group. It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In the light emitting element according to the present invention, a metal oxide, or a metal nitride and a metal nitride oxide may be used.

As a specific material for the case of having a function as an electron accepting substance, an oxide of a transition metal belonging to any one of Groups 4 to 12 of the periodic table can be used. Above all, many of the oxides of transition metals belonging to any one of Groups 4 to 12 of the periodic table have a high electron accepting property. In particular, vanadium oxide, molybdenum oxide, niobium oxide, rhenium oxide, tungsten oxide, ruthenium oxide, titanium oxide, chromium oxide, zirconium oxide, hafnium oxide, and tantalum oxide are suitable.

Further, as the metal mentioned above for the case of having a function as an electron donating substance, a substance selected from alkali metals and alkaline earth metals, specifically, lithium (Li), calcium (Ca), sodium (Na), potassium (K), magnesium (Mg), and the like can be used. Specific materials include oxides of the alkali metals or the alkaline earth metals mentioned above, nitrides of the alkali metals, and nitrides of the alkaline earth metals, specifically, lithium oxide ($Li_2O$), calcium oxide (CaO), sodium oxide ($Na_2O$), potassium oxide ($K_2O$), and magnesium oxide (MgO). In addition, fluorides of the alkali metal, and the like, specifically, lithium fluoride (LiF), cesium fluoride (CsF), calcium fluoride ($CaF_2$), and the like may be used.

Further, it is possible that the light emitting element according to the present invention have a layer in which the triazine derivative according to the present invention and the metal oxide that is an inorganic compound are mixed, or a layer in which the triazine derivative and the metal oxide that is an inorganic compound are laminated (hereinafter, referred to as a mixed layer collectively).

This triazine derivative according to the present invention can be used as a layer that generates electrons (electron generating layer) or a light emitting layer in the light emitting element.

When the triazine derivative according to the present invention is used for a layer that generates electrons (electron generating layer), in the case of forming a mixed layer, lithium oxide ($Li_2O$), calcium oxide (CaO), sodium oxide ($Na_2O$), potassium oxide ($K_2O$), and magnesium oxide (MgO) can be cited as the metal oxide mentioned above. In addition, lithium fluoride (LiF), cesium fluoride (CsF), and calcium fluoride ($CaF_2$) can be used as a metal fluoride.

When the triazine derivative according to the present invention is used for a light emitting layer, the light emitting element has the triazine derivative represented by the general formula (1) and a luminescent material having an emission wavelength in the bandwidth of 400 to 500 nm between a pair of electrodes. It is to be noted that the triazine derivative according to the present invention can be used for either a host or a dopant.

Further, the present invention has a feature of a light emitting device that has the light emitting element described above.

By having a triazine derivative according to the present invention and a metal oxide that is an inorganic compound, a light emitting element that operates at a lower driving voltage can be obtained even when the element is made thicker.

Further, by using a triazine derivative according to the present invention for a light emitting layer, a light emitting element that is capable of exhibiting a luminescent color that is closer to a luminescent color derived from a luminescent material can be obtained.

Accordingly, by applying a light emitting element including a triazine derivative according to the present invention to a pixel, a light emitting device that is capable of displaying an image with favorable color reproducibility can be obtained.

Further, according to the present invention, a novel substance for manufacturing a light emitting element can be obtained, and then a light emitting element that has a new structure can be provided. Therefore, the range of material choice can be expanded when a light emitting element is manufactured.

BEST MODE FOR CARRYING OUT THE INVENTION

Figure 1:
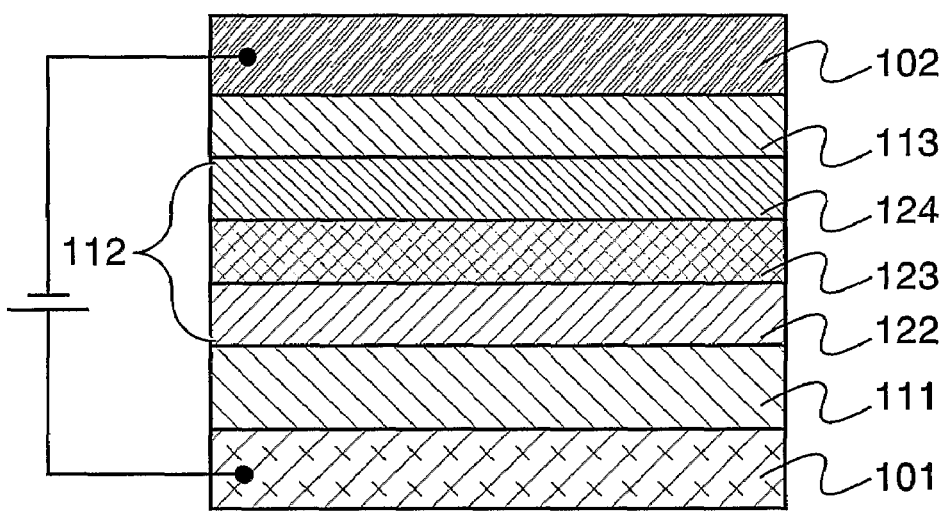
FIG. 1 is a cross-sectional view illustrating a light emitting element according to the present invention.

Embodiments of the present invention will be described specifically with reference to the accompanying drawings as below. However, the present invention is easily understood by those skilled in the art that various changes and modifications are possible, unless such changes and modifications depart from the content and the scope of the invention. Therefore, the present invention is not construed as being limited to the description of the following Embodiments. It is to be noted that the same portion or a portion having the same function is denoted by the same reference numeral in all the drawings for describing Embodiments, and the description thereof is omitted.

The triziane derivative according to the present invention mentioned includes 2,4,6-tris(9-oxo-10(9H)-acridinyl)-1,3,5-triazine, 2,4,6-tris(9-oxo-12(7H)-benzo[a]acrydinyl)-1,3,5-triazine, 2,4,6-tris(2-chloro-9-oxo-10(9H)-acrydinyl)-1,3,5-triazine, 2,4,6-tris(3-methoxy-9-oxo-10(9H)-acrydinyl)-1,3,5-triazine, 2,4,6-tris(2-methoxy-9-oxo-10(9H)-acrydinyl)-1,3,5-triazine, 2,4,6-tris(10-phenyl-dihydrophenazine-5-yl)-1,3,5-triazine, 2,4,6-tris(10-phenyl-benzo[a]dihydrophenazine-5-yl)-1,3,5-triazine, 2,4,6-tris(10-phenyl-dibenzo[a,c]dihydrophenazine-5-yl)-1,3,5-triazine, 2,4,6-tris(10-phenyl-dibenzo[a,i]dihydrophenazine-5-yl)-1,3,5,-triazine, 2,4,6-tris(10-methyl-dihydrophenazine-5-yl)-1,3,5-triazine, 2,4,6-tris[10-(4-dimethylamino)phenyl-dihydrophenazine-5-yl]-1,3,5-triazine, 2,4,6-tris[10-(2-pyridyl)-dihydrophenazine-5-yl]-1,3,5-triazine, 2,4,6-tris[10-(2-thienyl)-dihydrophenazine-5-yl]-1,3,5-triazine, 2,4,6-tris[10-(1-napthyl)-dihydrophenazine-5-yl]-1,3,5-triazine, 2,4,6-tris[9-(phenylimino)-10(9H)-acridinyl]-1,3,5-triazine, 2,4,6-tris[9-(1-napthylimino)-10(9H)-acridinyl]-1,3,5-triazine, 2,4,6-tris[9-(1-anthryl)-10(9H)-acridinyl]-1,3,5-triazine, 2,4,6-tris[9-(fluorophenylimino)-10(9H)-acridinyl]-1,3,5-triazine, 2,4,6-tris[9-(methoxyphenylimino)-10(9H)-acridinyl]-1,3,5-triazine, 2,4,6-tris[9-(tolylimino)-10(9H)-acridinyl]-1,3,5-triazine, 2,4,6-tris[9-N-{1,8-naphthalic anhydride-4-yl}imino-10(9H)-acridinyl]-1,3,5-triazine, 2,4,6-tris[9-(2-pyridylimino)-10(9H)-acridinyl]-1,3,5-triazine, 2,4,6-tris[9-N-(1,3-benzothiazole-2-yl)imino-10(9H)-acridinyl]-1,3,5-triazine, 2,4,6-tris(9-benzylidene-10(9H)-acridinyl)-1,3,5-triazine, 2,4,6-tris[9-(2-naphthylidene)-10(9H)-acridinyl]-1,3,5-triazine, 2,4,6-tris[9-(anthracene-9-ylidene)-10(9H)-acridinyl]-1,3,5-triazine, 2,4,6-tris[9-(diphenylmethylidene)-10(9H)-acridinyl]-1,3,5-triazine, 2,4,6-tris[9-(2-biphenylidene)-10(9H)-acridinyl]-1,3,5-triazine, 2,4,6-tris[9-(methylbenzylidene)-10(9H)-acridinyl]-1,3,5-triazine, 2,4,6-tris[9-(fluorobenzylidene)-10(9H)-acridinyl]-1,3,5-triazine,
2,4,6-tris[9-(2-pyridylidene)-10(9H)-acridinyl]-1,3,5-triazine,
2,4,6-tris[9-(2-thienylidene)-10(9H)-acridinyl]-1,3,5-triazine,
2,4,6-tris(9,9-diphenyl-9,10-dihydro-9-acridinyl)-1,3,5-triazine,
2,4,6-tris[9-(dicyanomethylidene)-10(9H)-acridinyl]-1,3,5-triazine,
2,4,6-tris(3-methoxy-4(1H)-pyridinone-1-yl)-1,3,5-triazine,
2,4,6-tris(3,4-dicyano-2,6-dimethyl-4(1H)-pyridinone-1-yl)-1,3,5-triazine,
2,4,6-tris(2,6-dimethoxycarbonyl-4(1H)-pyridinone-1-yl)-1,3,5-triazine,
2,4,6-tris[2,6-bis(2-pyridyl)-4(1H)-pyridinone-1-yl]-1,3,5-triazine,
2,4,6-tris(3,5-diacetyl-2,6-dimethyl-1,4-dihydropyridine-1-yl)-1,3,5-triazine,
2,4,6-tris(3,5-diethoxycarbonyl-2,6-dimethyl-1,4-dihydropyridine-1-yl)-1,3,5-triazine,
2,4,6-tris[3,3,6,6-tetramethyl-3,4,6,7,9,10-hexahydro-1,8(2H,5H)-acridinedione-10-yl]-1,3,5-triazine,
2,4,6-tris(3,5-dicyano-2,4,4,6-tetramethyl-1,4-dihydropyridine-1-yl)-1,3,5-triazine,
2,4,6-tris(1,5-dicyano-2,4-dimethyl-3-azaspiro[5,5]undeca-1,4-diene-1-yl)-1,3,5-triazine,
2,4,6-tris(3,5-dicyano-2,6-dimethyl-4-phenyl-1,4-dihydropyridene-1-yl)-1,3,5-triazine,
2,4,6-tris[3,5-dicyano-4-(2-furyl)-2,6-dimethyl-1,4-dihydropyridene-1-yl]-1,3,5-triazine,
2,4,6-tris[3,5-dicyano-2,6-dimethyl-4-(3-pyridyl)-1,4-dihydropyridene-1-yl]-1,3,5-triazine,
2,4,6-tris[3,5-dicyano-2,6-dimethyl-4-(2-thienyl)-1,4-dihydropyridine-1-yl]-1,3,5-triazine,
2,4,6-tris[9-isopropyl-3,4,6,7,9,10-hexahydro-1,8-(2H,5H)-acridinedione-1-yl]-1,3,5-triazine, and
2,4,6-tris{8-phenyl-5,8-dihydro-1H,3H-difuro[3,4-b:3,4-e]pyridine-1,7(4H)-dione-1-yl}-1,3,5-triazine.

Then, a light emitting element in which at least one of the triazine derivatives mentioned above and a metal oxide that is an inorganic compound are provided between a pair of electrodes can be manufactured. In this case, a layer in which the triazine derivative and the metal oxide are mixed is preferably formed.

By mixing a triazine derivative and a metal oxide in a layer, increasing of driving voltage can be prevented even if a film of the layer is thickened.

When a layer in which another organic compound and the metal oxide are mixed is provided in addition to a layer including a triazine derivative, increase in the driving voltage due to thickening the layer including the metal oxide can be prevented besides a layer in which the triazine derivative and the metal oxide are mixed.

In general, it is not preferable that a layer of a light emitting element is made thicker since the driving voltage is increased. However, in a light emitting element including an extremely thin film, a short circuit between electrodes can be prevented by thickening, and improvement of mass-productivity is expected. Then, inventers have found out that increase in driving voltage can be prevented by forming a layer in which an organic compound and a metal oxide that is an inorganic compound are included between a pair of electrodes even when a layer of a light emitting element is made thicker.

Vanadium oxide, molybdenum oxide, niobium oxide, rhenium oxide, tungsten oxide, ruthenium oxide, titanium oxide, chromium oxide, zirconium oxide, hafnium oxide, and tantalum oxide are suitable for this metal oxide. These materials have a function as an electron accepting substance.

As an electron donating substance, a metal oxide such as lithium oxide ($Li_2O$), calcium oxide (CaO), sodium oxide ($Na_2O$), potassium oxide ($K_2O$), magnesium oxide (MgO), and the like can be used. In addition, there is a metal fluoride as an electron donating substance, and specifically, lithium fluoride (LiF), cesium fluoride (CsF), calcium fluoride ($CaF_2$), and the like can be cited.

In the light emitting element according to the present invention, metal nitride, metal nitride oxide, and metal fluoride can be used in addition to the metal oxide mentioned above.

Accordingly, a layer of a light emitting element is made thicker, a short circuit between electrodes can be prevented, and the mass-productivity can be improved, which are preferable.

Further, the layer in which the triazine derivative according to the present invention, a metal oxide, and the like are mixed can be manufactured by a co-evaporation method. In specific, the co-evaporation of resistance-heating evaporation, the co-evaporation of electron beam evaporation, and the co-evaporation of the resistance-heating evaporation and the electron beam evaporation can be cited. The including layer described above can be formed to combine similar type methods. Further, a different type method may be combined with the evaporation method. For example, deposition of the resistance-heating evaporation and sputtering method, the deposition of the electron beam evaporation and the sputtering, and the like can be used for manufacturing the mixed layer. The above example shows a layer including two types of materials of a triazine derivative and a metal oxide. However, in the case of a layer including three or more types of materials, the layer can be formed by combining the similar type and the different type methods.

Embodiment 1

In the present embodiment, the structure of a light emitting element having a triazine derivative according to the present invention will be described.

A light emitting element according to the present invention, as shown in FIG. 1, has a first electrode 101 and a second electrode 102 which are opposed to each other, and has a first layer 111, a second layer 112, and a third layer 113 which are stacked in this order from the first electrode 101. When a voltage is applied to this light emitting element so that the potential of the first electrode 101 is higher than that of the second electrode 102, holes are injected into the second layer 112 from the first layer 111, and electrons are injected into the second layer 112 from third layer 113. The holes and the electrons are recombined in the second layer 112 to excite a luminescent material. Then, light is emitted when the luminescent material in the excited state returns to the ground state.

Next, the first layer 111 to the third layer 113, the first electrode 101, and the second electrode 102 will be described.

The first layer 111 is a layer that generates holes (hole generating layer). As this layer, for example, a layer containing a hole transporting substance and a substance that exhibits an electron accepting property with respect to the hole transporting substance can be cited. Further, it is preferable that the substance that exhibits the electron accepting property with respect to the hole transporting substance be included so that a molar ratio of the substance that exhibits the electron accepting property with respect to the hole transporting substance (=the material having the electron accepting property with respect to the material with the hole transporting property/the substance with the hole transporting property) is 0.5 to 2.

The hole transporting substance is a substance of which a transporting property is higher than an electron transporting property. For example, organic compounds such as aromatic amine compounds such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4,4"-tris[N-(3-methylphenyl)-N-phenylamino]triphenylamine (abbreviation: MTDATA), and 4,4'-bis[N-{4-(N,N-di-m-tolylamino)phenyl}-N-phenylamino] biphenyl (abbreviation: DNTPD), and phthalocyanine compounds such as phthalocyanine (abbreviation: $H_2Pc$), copper phthalocyanine (abbreviation: CuPc), and vanadyl phthalocyanine (abbreviation: VOPc) can be used. It is to be noted that the transporting substance is not limited to these.

Further, an oxide of a transition metal belonging to any one of Groups 4 to 12 of the periodic table can be used for the substance that exhibits the electron accepting property with respect to the hole transporting substance. Above all, many oxides of transition metals belonging to any one of Groups 4 to 8 have a high electron accepting property. In particular, vanadium oxide, molybdenum oxide, niobium oxide, rhenium oxide, tungsten oxide, ruthenium oxide, titanium oxide, chromium oxide, zirconium oxide, hafnium oxide, and tantalum oxide are suitable. It is to be noted that the substance that exhibits the electron accepting property with respect to the hole transporting substance is not limited to these.

The first layer 111 can be formed by an evaporation method. In the case of forming a mixed layer, a co-evaporation method can be used. For example, a first layer 111 in which a hole transporting substance and a substance (the metal oxide described above as an example) that exhibits an electron accepting property with respect to the transporting substance are included can be manufactured by the co-evaporation method. As the evaporation method for forming the first layer 111, similar type and different type methods such as the co-evaporation method of the resistance-heating evaporations, the co-evaporation of electron beam the evaporations, the co-evaporation of the resistance-heating evaporation and the electron beam evaporation, the deposition of the resistance-heating evaporation and the sputtering, and the deposition of the electron beam evaporation and the sputtering can be combined. Although the above example is applied to a layer including materials of two types, a layer including materials of three or more of types can also be formed by combining the similar type and the different type methods as mentioned above.

It is to be noted that the first layer 111 may include another organic compound. Rubrene and the like can be cited as the organic compound. The reliability can be improved by adding rubrene.

In addition, the first layer 111 may be a layer composed of a metal oxide such as molybdenum oxide, vanadium oxide, ruthenium oxide, cobalt oxide, and copper oxide.

It is preferable that the first layer 111 be formed by a layer having the organic compound, the metal oxide, and the like as described above since the conductivity is higher. When the conductivity is higher, the first layer can be made thicker.

Further, crystallization of an organic compound layer can be suppressed by using a layer having the organic compound, the metal oxide, and the like, and the organic compound layer can be thus formed to be thicker without increase in resistance. Therefore, even when there is irregularity due to dust, contamination, and the like on a substrate, the organic compound layer is hardly affected by the irregularity since the organic compound layer is made thicker. Thus, defects such as a short caused by the irregularity can be prevented.

The second layer 112 is a layer including a light emitting layer. The layer including the light emitting layer may be a single layer composed of only the light emitting layer or a multilayer. A specific multilayer includes one or more layers selected from an electron transporting layer, a hole transporting layer, and a hole injection layer in addition to the light emitting layer. FIG. 1 shows a case in which the second layer 112 is a multilayer including an electron transporting layer 124 and a hole transporting layer 122 in addition to a light emitting layer 123.

It is preferable that the light emitting layer be a layer in which a luminescent material is dispersed in a material that has a larger energy gap than the luminescent material. However, the light emitting layer is not limited to this. It is to be noted that the energy gap indicates the energy gap between the LUMO level and the HOMO level. Further, a material that provides a favorable luminous efficiency and is capable of emitting light with a desired wavelength may be used for the luminescent material.

The triazine derivative according to the present invention can be used as a luminescent material and a material that has a larger energy gap than that of the luminescent material.

As a material that is used for dispersing the luminescent material, for example, in addition to an anthracene derivative such as 9,10-di(2-naphthyl)-2-tert-butylanthracene (abbreviation: t-BuDNA) and a carbazole derivative such as 4,4'-bis (N-carbazolyl)biphenyl (abbreviation: CBP), metal complexes such as bis[2-(2-hydroxyphenyl)pyridinatozinc] (abbreviation: $Znpp_2$) and bis[2-(2-hydroxyphenyl)benzoxazolato]zinc (abbreviation: ZnBOX), and the like can be used. However, the material using for dispersing the luminescent material is not limited to these materials. When the luminescent material is dispersed as described above, quenching of luminescence from the luminescent material due to the concentration of the luminescent material can be prevented.

In order to exhibit white or whitish light emission from this second layer 112, for example, a structure in which, from the first electrode 101, TPD (aromatic diamine), 3-(4-tert-butylphenyl)-4-phenyl-5-(4-biphenylyl)-1,2,4-triazole (abbreviated: TAZ), tris(8-quinolinolato)aluminum (abbreviation: $Alq_3$), $Alq_3$ doped with Nile Red that is a red luminescent dye, and $Alq_3$ are laminated in this order by a evaporation method or the like can be used.

In addition, a structure in which, from the first electrode 101, NPB, NPB doped with perylene, bis(2-methyl-8-quinolinolato)-4-phenylphenolato-aluminum (abbreviation: BAlq) doped with DCM1, BAlq, and $Alq_3$ are laminated in this older by an evaporation method or the like can be used.

Further, 2-(4-biphenylyl)-5-(4-tert-butylphenyl)-1,3,4-oxadiazole (abbreviation: PBD) of 30 wt % is dispersed in poly(N-vinylcarbazole) (abbreviation: PVK) as an electron transporting agent, and then an appropriate amounts of 4 types of pigments (TPB, coumarin 6, DCM 1, and Nile Red) are dispersed to obtain whitish light emission.

In addition, the second layer 112 is made to have a laminated structure, and the laminated structure is formed by materials that produce luminescence in relationship of complementary colors to each other, for example, a first layer and a second layer using luminescent materials for red and blue-green, to obtain white or whitish light emission.

It is to be noted that materials for the light emitting layer can be appropriately selected besides the light emitting elements described above, which provide white or whitish light emission. For example, the second layer 112 may be formed from each luminescent material for red (R), green (G), and blue (B).

In order to obtain red or reddish luminescence, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCJT), 4-dicyanomethylene-2-tert-butyl-6-[2-(1,1,7,7- tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: Ir[Fdpq]$_2$acac), and the like can be used. However, the luminescent material is not limited to these materials, and a material that produces luminescence with an emission spectrum peak from 600 to 700 nm can be used.

In order to obtain green or greenish luminescence, N,N'-dimethylquinacridon (abbreviation: DMQd), coumarin 6, coumarin 545T, tris(8-quinolinolate)aluminum (abbreviation: Alq$_3$), and the like can be used. However, the luminescent material is not limited to these materials, and a material that produces luminescence with an emission spectrum peak from 500 to 600 nm can be used.

The triazine derivative according to the present invention can function also as a layer including a light emitting layer that produces blue or bluish luminescence. The triazine derivative according to the present invention can be specifically used as a host material for the light emitting layer that produces blue or bluish luminescence. Therefore, the light emitting element according to the present invention has a layer including the triazine derivative according to the present invention and a luminescent material with an emission wavelength in the bandwidth from 400 to 500 nm between a pair of electrodes to produce blue or bluish luminescence. It is to be noted that the triazine derivative according to the present invention can be used for either a host or a dopant.

Further, in order to obtain blue or bluish luminescence, 9,10-bis(2-naphthyl)-tert-butylanthracene (abbreviation: t-BuDNA); 9,9'-bianthryl, 9,10-diphenylanthracene (abbreviation: DPA), 9,10-bis(2-naphthyl)anthracene (abbreviation: DNA), bis(2-methyl-8-quinolinolate)-4-phenylphenolate-gallium (abbreviation: BGaq), bis(2-methyl-8-quinolinolate)-4-phenylphenolate-aluminum (abbreviation: BAlq), and the like can be used in addition to the layer containing the triazine derivative according to the present invention. However, the luminescent material is not limited to these materials, and a material that produces luminescence with an emission spectrum peak from 400 to 500 nm can be used.

When the second layer 112 is formed to have each luminescent material for red (R), green (G), and blue (B), a color filter or a color conversion layer may be additionally provided to adjust the peak of each of luminescence spectrum peak and the like. The color filter and the color conversion layer may be formed on the side where luminescence is extracted outside, that is, can be provided either on the substrate side where a thin film transistor is formed or on the opposed substrate thereto side.

The second layer 112 can be manufactured by an evaporation method. In the case of forming a mixed layer, a co-evaporation method can be used. The co-evaporation method for forming the second layer 112 can be used to combine similar type and different type methods such as the co-evaporation method of the resistance-heating evaporation, the co-evaporation of electron beam the evaporation, the co-evaporation of the resistance-heating evaporation and the electron beam evaporation, the deposition of the resistance-heating evaporation and the sputtering, and the co-deposition of the electron beam deposition and the sputtering. Although the above example is applied to a layer including two types of materials, a layer including three or more types of materials can be formed by combining the similar type and the different type methods as described above.

The third layer 113 is a layer that generates electrons (electron generating layer). The triazine derivative according to the present invention can be applied to the third layer 113, namely, the layer that generates the electrons. As the layer like this, for example, a layer containing an electron transporting substance and a substance that exhibits an electron donating property with respect to the electron transporting substance can be cited in addition to a layer containing the triazine derivative according to the present invention.

It is to be noted that the electron transporting substance is a substance of which an electron transporting property is higher than a hole transporting property. For example, metal complexes such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolate-aluminum (abbreviation: BAlq), bis[2-(2-hydroxyphenyl)benzoxazolate]zinc (abbreviation: Zn(BOX)$_2$), and bis[2-(2-hydroxyphenyl)benzothiazolate] zinc (abbreviation: Zn(BTZ)$_2$) can be used. The following materials can be used as the electron transporting substance: 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); 4,4'-bis(5-methyl-benzoxazole-2-yl) stilbene (abbreviation: BzOs); and the like. Further, the third layer 113 can be formed by using an n-type semiconductor. However, the electron transporting substance is not limited to these.

For a substance that exhibits an electron donating property with respect to the electron transporting substance, a material selected from alkali metals and alkaline earth metals, specifically, lithium (Li), calcium (Ca), sodium (Na), potassium (K), magnesium (Mg), and the like can be used. Further, specific materials include oxides of the alkali metals and alkaline earth metal mentioned above, a nitride of the alkali metal, a nitride of the alkaline earth metal, specifically, lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), calcium fluoride (CaF$_2$). However, the substance that exhibits the electron donating property with respect to the electron transporting substance is not limited to these. It is preferable that the substance that exhibits the electron donating property with respect to the electron transporting substance be included so that a molar ratio of the substance that exhibits the electron donating property with respect to the electron transporting substance (=the substance that exhibits the electron donating property with respect to the electron transporting substance/the electron transporting substance) is 0.5 to 2.

Alternatively, the third layer 113 may be a layer composed of such as zinc oxide, zinc sulfide, zinc selenide, tin oxide or titanium oxide.

When the triazine derivative according to the present invention is applied to the layer that generates electrons and a layer in which the triazine derivative and a metal oxide are mixed is formed, it is preferable that any one of lithium oxide (Li$_2$O), calcium oxide (CaO), sodium oxide (Na$_2$O), potassium oxide (K$_2$O), magnesium oxide (MgO), and lithium fluoride (LiF) be used in the metal oxide. In addition, for the layer that generates electrons, any one of cesium fluoride (CsF) and calcium fluoride (CaF$_2$) may be used. For example, in the case of using the lithium oxide, it is believed that the triazine derivative functions as the electron transporting substance and the lithium oxide functions as the substance that exhibits the electron donating property with respect to the electron transporting substance.

The third layer 113 can be manufactured by an evaporation method. In the case of forming a mixed layer, a co-evaporation method can be used. The co-evaporation method for forming the third layer 113 can be used to combine similar type and different type methods such as the co-evaporation method of the resistance-heating evaporation, the co-evaporation of electron beam the evaporation, the co-evaporation of the resistance-heating evaporation and the electron beam evaporation, the deposition of the resistance-heating evaporation and the sputtering, and the deposition of the electron beam evaporation and the sputtering. Although the above example is assumed a layer including two types of materials, a layer including three or more of types of materials can be formed to combine the similar type and the different type methods as mentioned above.

The first layer 111 to the third layer 113 can be formed by the same method, in particular, the first layer 111 to the third layer 113 can be formed by multichamber. Therefore, the layers can be formed continuously without being exposed to the atmosphere. Forming the first layer 111 to the third layer 113 continuously without being exposed to the atmosphere in this way makes it possible to reduce mixing of impurities into an interface and the like.

In the light emitting element described above, the difference in electron affinity between the electron transporting substance, which is included in the third layer 113, and a substance which is included in the layer in contact with the third layer 113 among the layers included in the second layer 112, is preferably made to be 2 eV or less, more preferably, 1.5 eV or less. When the third layer 113 comprises an n-type semiconductor, the difference between the work function of the n-type semiconductor and the electron affinity of the material, which is included in the layer in contact with the third layer 113 among the layers included in the second layer 112, is preferably made to be 2 eV or less, more preferably, 1.5 eV or less. Therefore, by contacting the second layer 112 to the third layer 113, electrons can easily be injected into the second layer 112 from the third layer 113.

It is to be noted that the present invention has a feature of a light emitting element including the triazine derivative between a pair of electrodes and is not limited to the structure of the light emitting element shown in FIG. 1. For example, although the structure in which the electron transporting layer 124 is provided in contact with the third layer 113 is shown, there may be a case in which the electron transporting layer 124 is not provided. Then, the light emitting layer 123 in contact with the third layer 113 is provided. In this case, a material for dispersing the luminescent material is preferable used for the light emitting layer 123. It may well be that there is a case in which the hole transporting layer 122 is not provided.

Further, a material that can emit light such as Alq$_3$ without being dispersed can be used for the light emitting layer 123. Since the material such as Alq$_3$ is a luminescent material that has an excellent carrier transporting property, a layer composed of only Alq$_3$ can function as a light emitting layer without dispersing Alq$_3$. In this case, the light emitting layer 123 corresponds to the luminescent material itself.

Further, in the second layer 112, a layer that functions as an electron injecting layer can be provided for making it easier to inject electrons into the second layer 112 from the third layer 113. In the second layer 112, similarly, a layer that functions as a hole injecting layer can be provided for making it easier to inject holes into the second layer 112 from the first layer 111.

Next, electrodes will be described. Each of the first electrode 101 and the second electrode 102 is formed by using a conductive material. Further, it is necessary that the electrode provided on the side where light from the light emitting layer is extracted outside have a light-transmitting property in addition to conductivity. The light-transmitting property can be obtained also by forming a quite thin film composed of a non-light-transmitting material.

As a material for the first electrode 101, light-transmitting materials such as indium tin oxide (ITO), indium tin oxide containing silicon oxide (referred to as ITSO), or indium oxide containing zinc oxide can be used in addition to aluminum. Additionally, metal materials such as gold (Au), platinum (Pt), nickel (Ni), tungsten (W), chromium (Cr), molybdenum (Mo), iron (Fe), cobalt (Co), copper (Cu), or palladium (Pd) can be used. However, the material for the first electrode 101 is not limited to these.

When the non-light-transmitting material described above is used and the first electrode 101 needs to have a light-transmitting property, a film composed of the material may be formed.

Further, for the first electrode 101, a single layer of the metal material mentioned above or a lamination layer can be used. Therefore, when a lamination layer is used for the first electrode 101, a structure in which the above material is formed to be thin and a light-transmitting material is laminated thereon may be used. As a matter of course, the first electrode 101 may be formed with the use of the thin material as a single layer. An auxiliary wiring can be provide in order to prevent the resistance from increasing by forming the first electrode 101 to be thin. Further, the resistance can be prevented from increasing by using a lamination layer in electrodes.

As a material for the second electrode 102, light-transmitting materials such as indium tin oxide (ITO), indium tin oxide containing silicon oxide (ITSO), or indium oxide containing zinc oxide can be used. Additionally, metal materials such as gold (Au), platinum (Pt), nickel (Ni), tungsten (W), chromium (Cr), molybdenum (Mo), iron (Fe), cobalt (Co), copper (Cu), or palladium (Pd) can be used. However, the material of the second electrode 102 is not limited to these.

When the above material having the non-light-transmitting property and the first electrode 101 is necessary for the transmitting property, the above material may be formed with a thin thickness.

Further, for the second electrode 102, a single layer of the metal material mentioned above or a lamination layer can be used. Therefore, when a laminated layer is used for the second electrode 102, a structure in which the above material is formed to be thin and a light-transmitting material is laminated thereon may be used. As a matter of course, the second electrode 102 may be formed with the use of the thin material as a single layer. An auxiliary wiring can be provide in order to prevent the resistance from increasing by forming the second electrode 102 to be thin. Further, the resistance can be prevented from increasing by using a lamination layer.

The first electrode 101 or the second electrode 102 can be formed by sputtering, an evaporation method, or the like. When an evaporation method is used, appropriately, the first electrode 101, the first layer 111 to the third layer 113, and the second electrode 102 can be formed continuously without being exposed to the atmosphere. Forming the light emitting element continuously without being exposed to the atmosphere makes it possible to reduce mixing of impurities into an interface and the like.

Embodiment 2

In the present embodiment, the structure of a light emitting element that is different from the light emitting element in the embodiment described above will be described.

Figure 2:
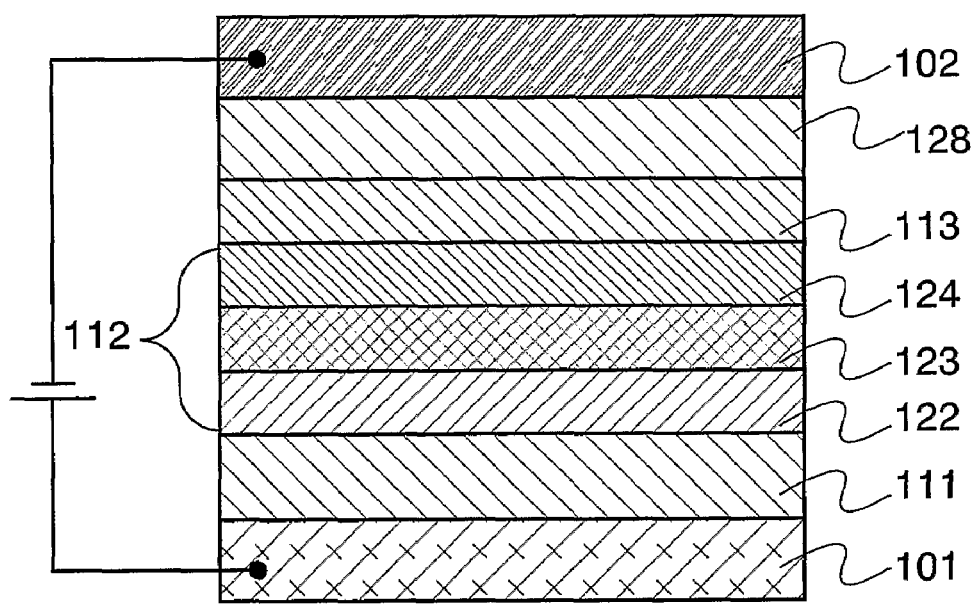
FIG. 2 is a cross-sectional view illustrating a light emitting element according to the present invention.

As shown in FIG. 2, a light emitting element shown in the present embodiment has a first electrode 101 and a second electrode 102 which are opposed to each other, and has a first layer 111, a second layer 112, a third layer 113, and a fourth layer 128 are stacked in this order from the first electrode 101 where it is a feature that the fourth layer 128 is provided. The fourth layer 128 can be formed from the similar material of the first layer 111, and the other structure is the similar as in the embodiment 1 described above. Therefore, the description of the structure will be omitted.

Providing the fourth layer 128 as described above makes it possible to reduce damage of forming the second electrode 102.

As a material included in the fourth layer 128 a layer in which at least one selected from the oxides such as vanadium oxide, molybdenum oxide, niobium oxide, rhenium oxide, tungsten oxide, ruthenium oxide, titanium oxide, chromium oxide, zirconium oxide, hafnium oxide, and tantalum oxide is mixed. Further, nitrides and oxynitrides of these metals may be used. When these metal oxides and the like are used, it is not necessary to increase the driving voltage even when the fourth layer 128 is made thicker.

By making the fourth layer 128 thicker, damage of forming the second electrode 102 can be expected to be further reduced.

Embodiment 3

In the present embodiment, a triazine derivative will be described.

A triazine derivative according to the present invention is represented by a general formula (8).

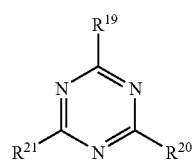

(8)

In the general formula (8), $R^{19}$ to $R^{21}$ are individually independent and any one of groups represented by formulas (9) to (15).

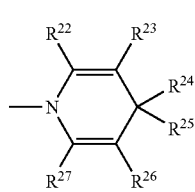

(9)

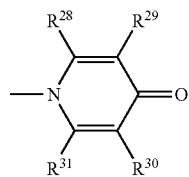

(10)

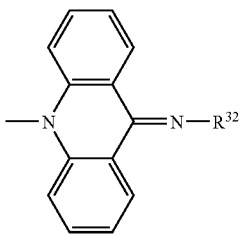

(11)

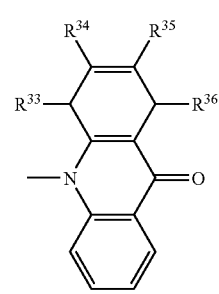

(12)

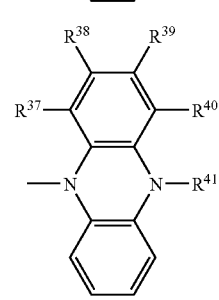

(13)

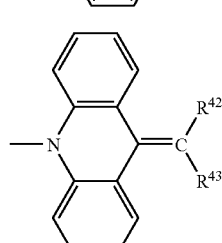

(14)

(15)

In the group represented by the formula (9), $R^{24}$ and $R^{25}$ are individually independent, or bonded to form a ring. When $R^{24}$ and $R^{25}$ are independent, $R^{24}$ and $R^{25}$ are individually any one of hydrogen, an alkyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 10 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative.

Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

When $R^{24}$ and $R^{25}$ are bonded to form a ring, the ring is an alicycle having 3 to 10 carbon atoms (preferably, 6 carbon atoms). The preferable number of carbon atoms in the alicycle is determined in consideration of a raw material and easiness of handling of the triazine derivative. When the number of carbon atoms in the alicycle is much increased, the melting point (Tg) of the compound may be greatly decreased, and it may be difficult to handle the compound.

$R^{22}$, $R^{23}$, $R^{26}$, and $R^{27}$ are individually independent, or $R^{22}$ and $R^{23}$, and $R^{26}$ and $R^{27}$ are individually bonded to form a ring. When $R^{22}$, $R^{23}$, $R^{26}$, and $R^{27}$ are individually independent, $R^{22}$, $R^{23}$, $R^{26}$, and $R^{27}$ are individually any one of hydrogen, an alkyl group having 1 to 6 carbon atoms, an alkoxy group having 1 to 6 carbon atoms, a halogen group, an acyl group having 1 to 6 carbon atoms, an alkoxycarbonyl group having 1 to 6 carbon atoms, a cyano group, an aryl group having 6 to 30 carbon atoms (preferably, 6 to 14 carbon atoms), and a heteroaromatic group (heteroaryl group) having 2 to 18 carbon atoms (preferably, 2 to 14 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative.

Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

When $R^{22}$ and $R^{23}$, $R^{26}$ and $R^{27}$ are individually bonded to form a ring, these rings are individually an alicycle having 3 to 10 carbon atoms (preferably, 6 carbon atoms). The preferable number of carbon atoms in the alicycle is determined in consideration of a raw material and easiness of handling of the triazine derivative. When the number of carbon atoms in the alicycle is much increased, the melting point (Tg) of the compound may be greatly decreased, and it may be difficult to handle the compound.

In the group represented by the formula (10), $R^{28}$ to $R^{31}$ are individually independent, and any one of hydrogen, an alkyl group having 1 to 6 carbon atoms, an alkoxy group having 1 to 6 carbon atoms, a halogen group, an acyl group having 1 to 6 carbon atoms, an alkoxycarbonyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 14 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative.

Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In the group represented by the formula (11), $R^{32}$ is any one of an aryl group having 6 to 30 carbon atoms (preferably, 6 to 14 carbon atoms) and a heteroaromatic group (heteroaryl group) having 2 to 18 carbon atoms (preferably, 2 to 10 carbon atoms). The preferable number of carbon atoms in the aryl group and the heteroaromatic group is determined in consideration of a raw material and easiness of handling of the triazine derivative. The aryl group may have a substitutent such as an alkyl group having 1 to 6 carbon atoms, an alkoxy group having 1 to 6 carbon atoms, an acyl group having 1 to 6 carbon atoms, an alkoxycarbonyl group having 1 to 6 carbon atoms, and a halogen group, or may be unsubstituted. It is to be noted that the alkyl group includes an aliphatic heterocyclic group in the present invention. However, it is preferable to use a chain alkyl group since handling of the triazine derivative is easy.

Further, it is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In addition, the aryl group and the heteroaromatic group may be individually condensed with another aromatic ring and another heterocyclic.

In the group represented by the formula (12), $R^{33}$ to $R^{36}$ may be individually independent and may be any one of hydrogen, an alkyl group having 1 to 6 carbon atoms, an alkoxy group having 1 to 6 carbon atoms, an acyl group having 1 to 6 carbon atoms, an alkoxycarbonyl group having 1 to 6 carbon atoms, and a halogen group. It is to be noted that the alkyl group includes an aliphatic heterocyclic group in the present invention. However, it is preferable to use a chain alkyl group since handling of the triazine derivative is easy. $R^{33}$ and $R^{34}$, $R^{34}$ and $R^{35}$, or $R^{35}$ and $R^{36}$, which are adjacent each other, may be bonded to form an aromatic ring. The aromatic ring may include an oxo group or the like.

In the group represented by the formula (13), $R^{36}$ to $R^{39}$ are individually independent, or bonded to form a ring. When $R^{36}$ to $R^{39}$ are individually independent, $R^{36}$ to $R^{39}$ are hydrogen. When $R^{37}$ and $R^{38}$ and $R^{39}$ and $R^{40}$ are individually bonded to form a ring, the ring is an aromatic ring. It is to be noted that the bond of $R^{37}$ and $R^{38}$ and the bond of $R^{39}$ and $R^{40}$ are individually independent.

$R^{41}$ is any one of an alkyl group having 1 to 6 carbon atoms, an aryl group having 6 to 30 carbon atoms (preferably, 6 to 14 carbon atoms), and a heteroaromatic group (heteroaryl group) having 2 to 18 carbon atoms (preferably, 2 to 10 carbon atoms). It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative. The aryl group may have a substitutent such as a dialkylamino group, or may be unsubstituted.

It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxide, and sulfur.

In the group represented by the formula (14), $R^{42}$ and $R^{43}$ are individually independent, and be hydrogen, an aryl group having 6 to 30 carbon atoms (preferably, 6 to 14 carbon atoms), a heteroaromatic group (heteroaryl group) having 2 to 18 carbon atoms (preferably, 2 to 10 carbon atoms), or a cyano group. The preferable number of carbon atoms is determined in consideration of a raw material and easiness of handling of the triazine derivative. The aryl group may have a substitutent such as an alkyl group having 1 to 6 carbon atoms, an aryl group having 6 to 30 carbon atoms (preferably, 6 to 14 carbon atoms), and a halogen group, or may be unsubstituted. It is to be noted that the alkyl group includes an aliphatic heterocyclic group in the present invention. However, it is preferable to use a chain alkyl group since handling of the triazine derivative is easy.

It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

In the group represented by the formula (15), Y is an aromatic group, a heterocyclic, or an alicycle. It is to be noted that the aromatic group may have a substitutent such as an oxo group, or may be unsubstituted. Further, it is preferable that the heterocyclic have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heterocyclic is preferable to contain any one atom of nitrogen, oxygen, and sulfur. $R^{44}$ and $R^{45}$ are individually independent, or bonded to form a ring. When $R^{44}$ and $R^{45}$ are independent, $R^{44}$ and $R^{45}$ are individually any one of hydrogen, an aryl group having 6 to 30 carbon atoms (preferably, 6 to 14), a heteroaromatic group (heteroaryl group) having 2 to 18 (preferably, 2 to 10), and an alkyl group having 1 to 6 carbon atoms. It is to be noted that the alkyl group includes an aliphatic heterocyclic group in the present invention. However, it is preferable to use a chain alkyl group since handling of the triazine derivative is easy. The preferable number of carbon atoms in the aryl group and the heteroaromatic group is determined in consideration of a raw material and easiness of handling of the triazine derivative.

It is preferable that the heteroaromatic group have a monocyclic structure of a 5-membered ring, a monocyclic structure of a 6-membered ring, a polycyclic structure containing any one of a 5-membered ring and a 6-membered ring, or a polycyclic structure containing both of a 5-membered ring and a 6-membered ring. Furthermore, the heteroaromatic group contains any one atom of nitrogen, oxygen, and sulfur.

When $R^{44}$ and $R^{45}$ are bonded to form a ring, the ring is an alicycle having 3 to 10 carbon atoms (preferably, 6 carbon atoms). The preferable number of carbon atoms in the alicycle is determined in consideration of a raw material and easiness of handling of the triazine derivative. When the number of carbon atoms in the alicycle is much increased, the melting point (Tg) of the compound may be greatly decreased, and it may be difficult to handle of the compound.

Specific examples of the groups represented by the formulas (9) to (15) are represented by in structural formulas (16) to (65).

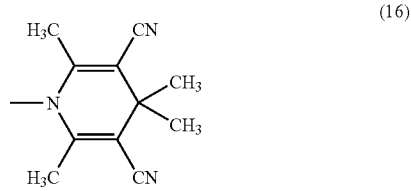
(16)

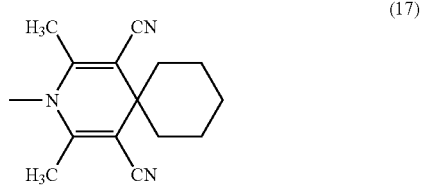
(17)

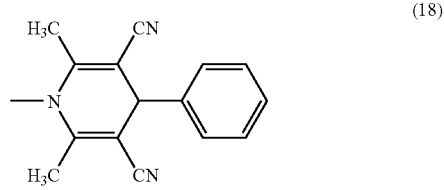
(18)

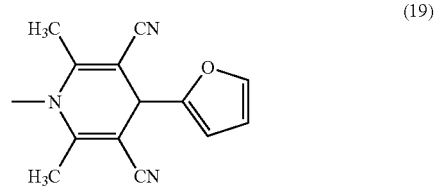
(19)

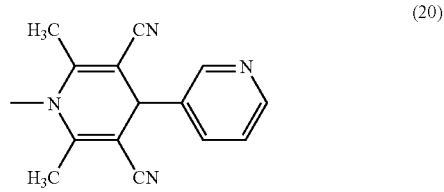
(20)

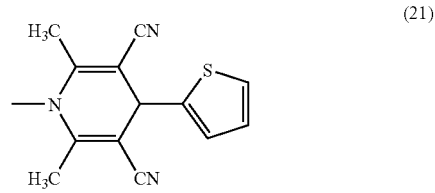
(21)

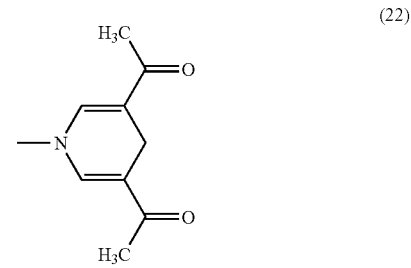
(22)

-continued
(23)
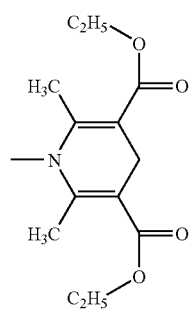
(24)
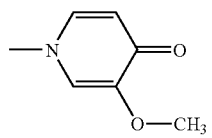
(25)
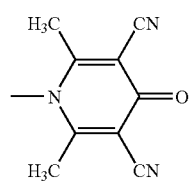
(26)
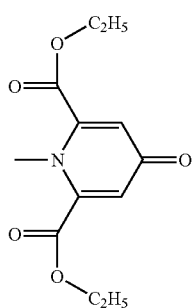
(27)
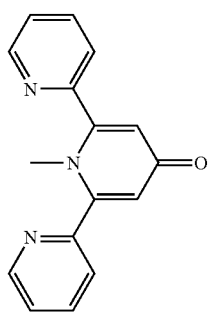
(28)
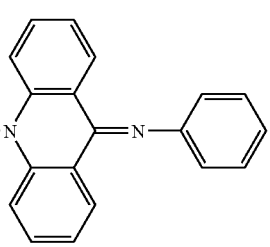
-continued
(29)
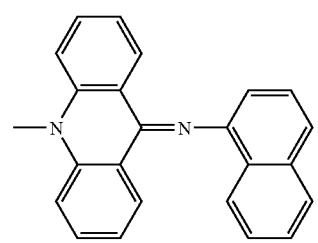
(30)
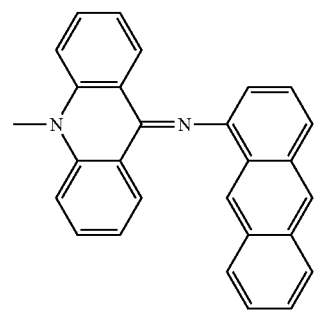
(31)
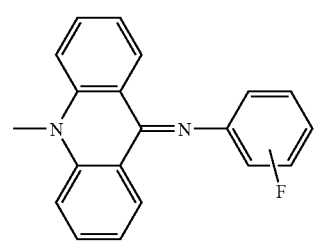
(32)
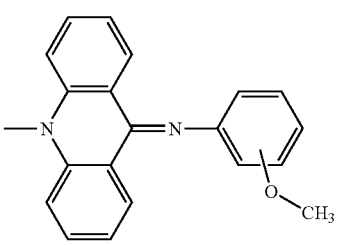
(33)
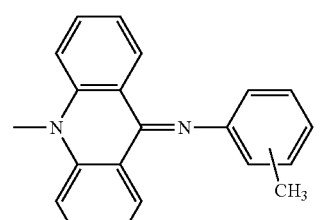
(34)
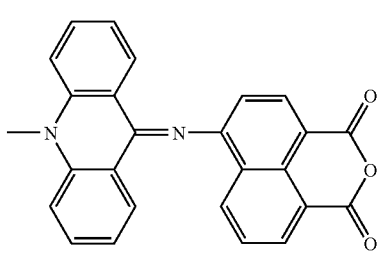

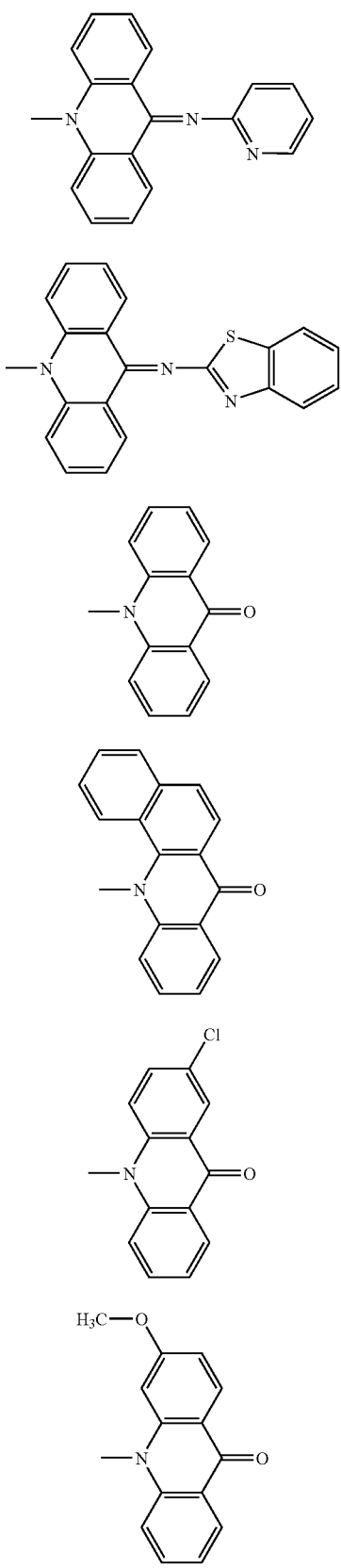
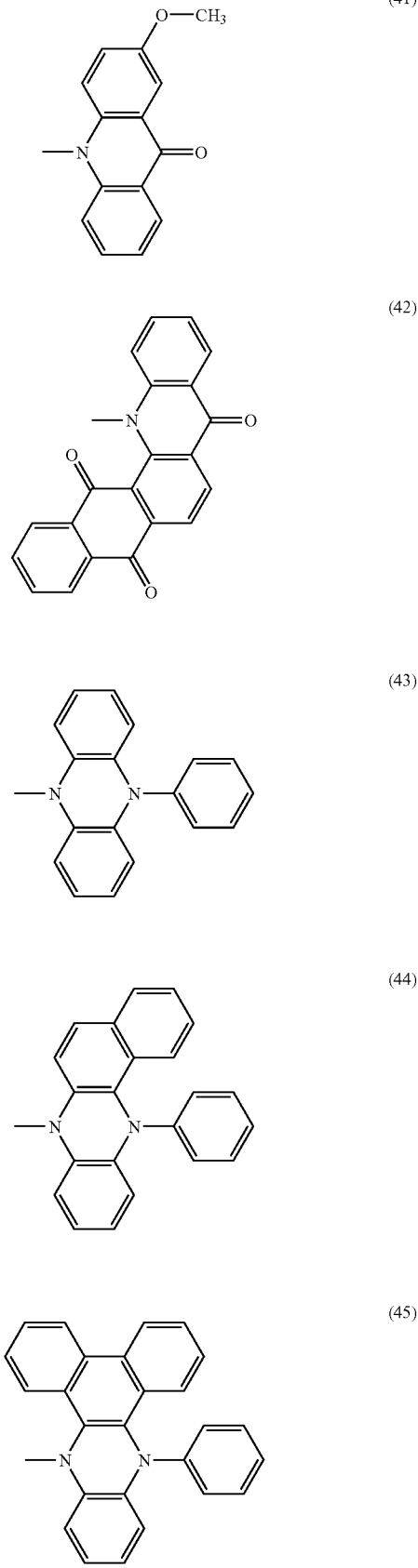

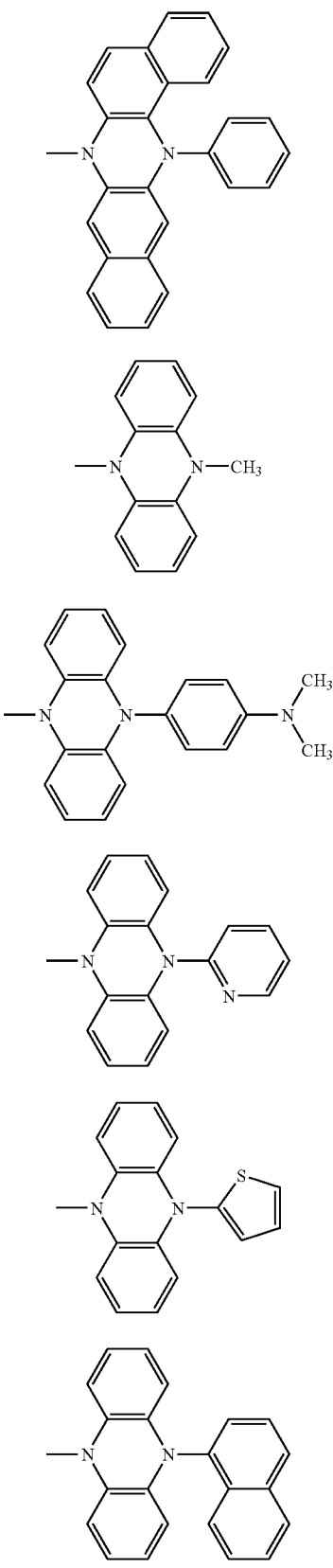

-continued

(58) 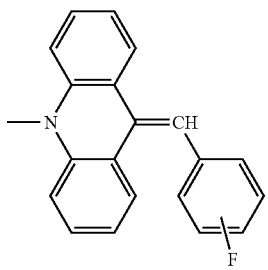

(59) 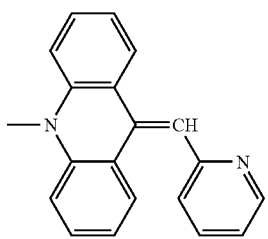

(60) 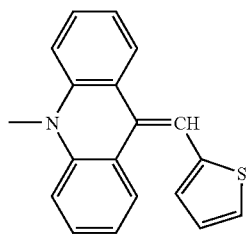

(61) 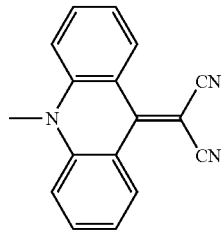

(62) 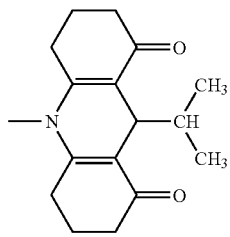

(63) 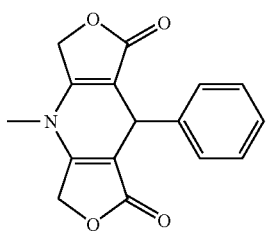

-continued

(64) 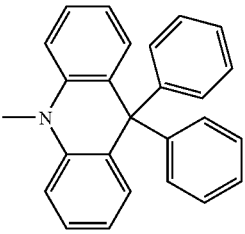

(65) 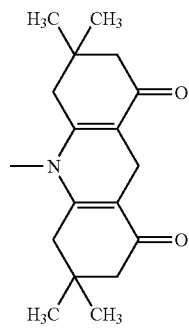

The above-described triazine derivative according to the present invention can be used as a material for manufacturing a light emitting element. As described above, a novel material for manufacturing a light emitting element can be obtained in accordance with the present invention.

The present embodiment can be freely combined with the embodiments described above. For example, a light emitting element that has a layer in which the triazine derivative according to the present invention and a metal oxide and the like are mixed can be formed by a co-evaporation method.

Embodiment 4

In the present embodiment, a structure of a display device having the light emitting element described above will be described.

Figure 3:
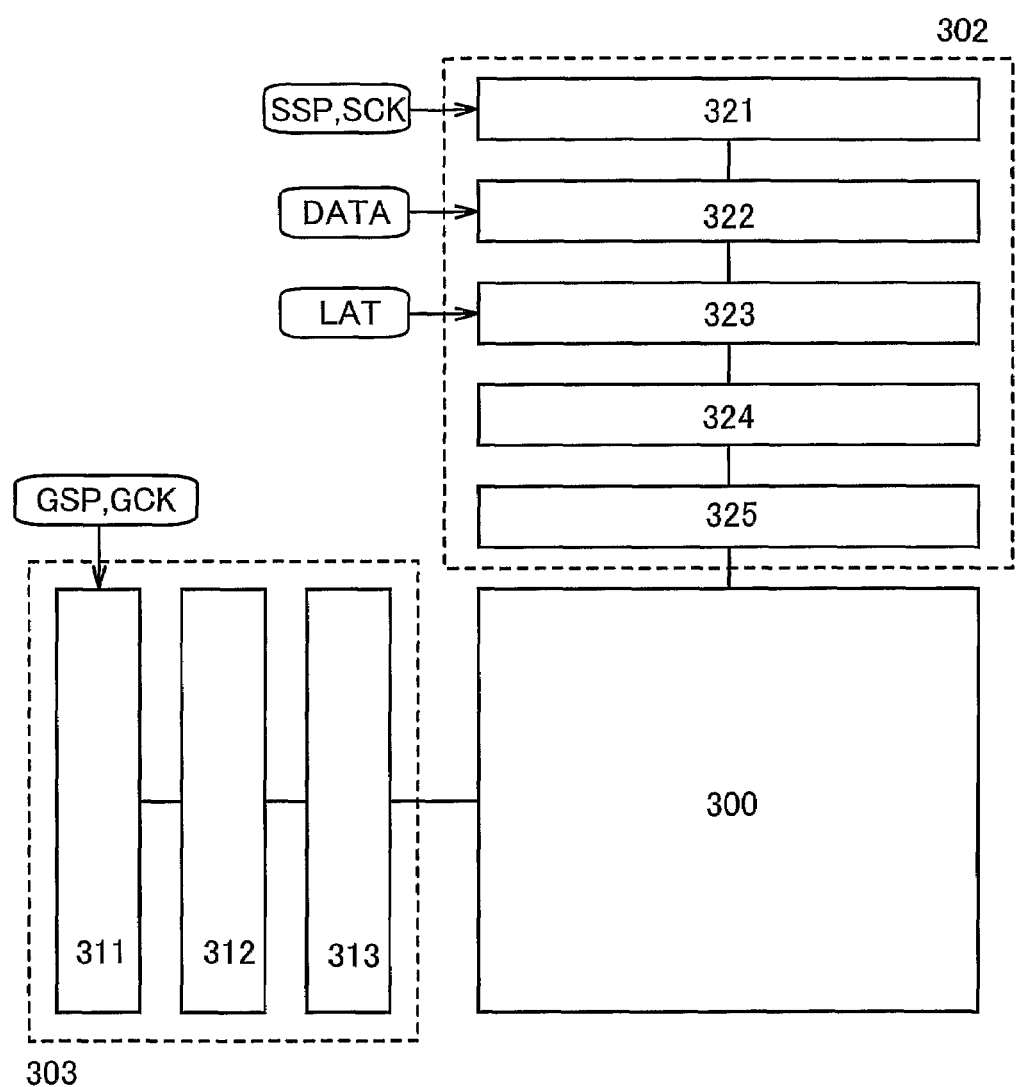
FIG. 3 is a diagram illustrating a panel according to the present invention.

In FIG. 3, a panel in which driver circuits such as a signal line driver circuit 302 and a scanning line driver circuit 303 are provided around a pixel portion 300 is shown.

The scanning line driver circuit 303 has circuits functioning as a shift register 311, a level shifter 312, and a buffer 313. Signals such as a gate start pulse (GSP), a gate clock signal (GCK), and the like are inputted into the shift register 311. It is to be noted that a scanning line driver circuit according to the present invention is not limited to these.

Further, the signal line driver circuit 302 has circuits functioning as a shift register 321, a first latch 313, a second latch 323, a level shifter 324, and a buffer 325. Signals such as a start pulse (SSP) and the like, data (DATA) such as a video signal and the like, and a latch (LAT) signal and the like are inputted into the shift register 321, the first latch 322, and the second latch 323, respectively. It is to be noted that the signal line driver circuit according to the present invention is not limited to these.

The pixel potion 300 has a plurality of pixels, and each of the pixels are provided with the light emitting element as described above. A semiconductor element for controlling current supply to the light emitting element is connected to each one of the light emitting elements. A cross section of the pixel having the light emitting element will be described in the following embodiment. It is to be noted that the pixel portion according to the present invention is not limited to this, and may have a passive type structure.

The signal line driver circuit 302, the scanning line driver circuit 303, and the pixel portion 300 can be formed by a semiconductor element provided over the same substrate. For example, a thin film transistor provided over a glass substrate can be used. Further, the signal line driver circuit 302 or the scanning line driver circuit 303 can be implemented over a glass substrate by using an IC chip.

The present embodiment can be freely combined with any one of the embodiments described above.

Embodiment 5

In the present embodiment, a cross section of a pixel having a light emitting element will be described.

Figure 4A:
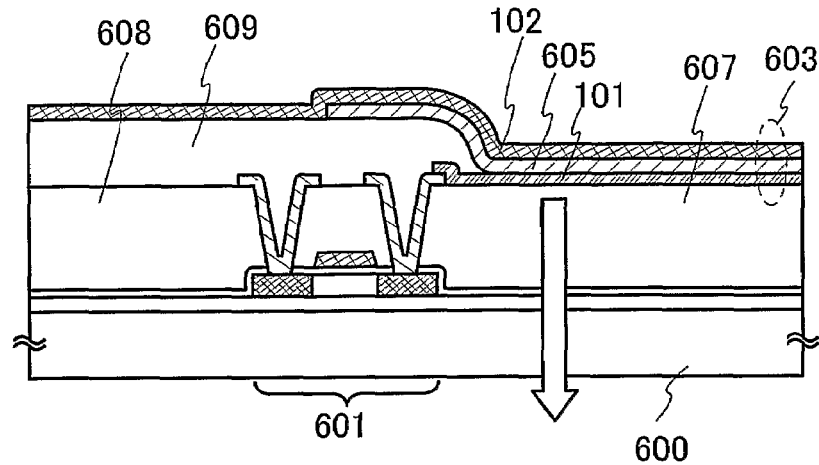
FIGS. 4A to 4C are cross-sectional views illustrating pixels according to the present invention.
Figure 4B:
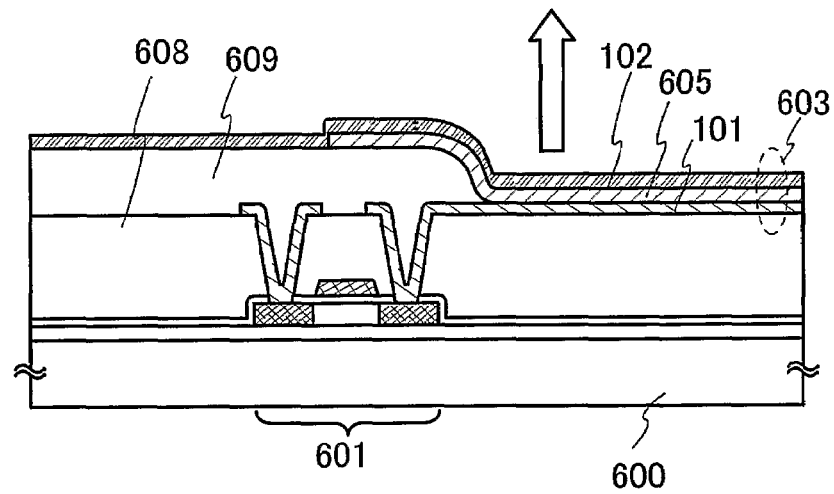
Figure 4C:
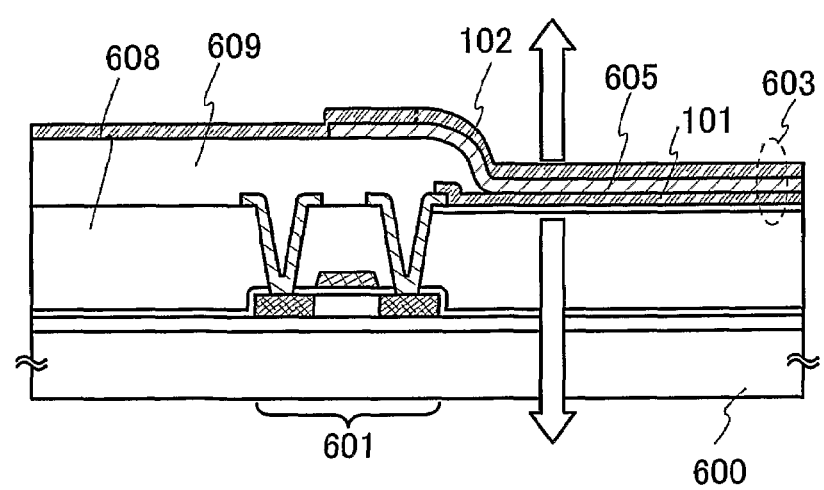

FIGS. 4A to 4C show cross-sectional views in which a p-type thin film transistor (TFT) as a semiconductor element for controlling current supply to a light emitting element is used, and the case in which a first electrode functions as an anode and a second electrode functions as a cathode in the light emitting element will be described.

FIG. 4A shows a cross-sectional view of a pixel where a TFT 601 is a p-type and light emitted from a light emitting element 603 is extracted from a first electrode 101 side. In FIG. 4A, the TFT 601 provided over a substrate 600 has a semiconductor film, a gate electrode that is provided over the semiconductor film with an insulating film interposed therebetween, and a wiring connected to an impurity region formed in the semiconductor film. Further, the wiring of the TFT 601 is electrically connected to the first electrode 101 in the light emitting element 603.

The TFT 601 is covered with an interlayer insulating film 608, and a partition (bank) 609 having an opening is formed on the interlayer insulating film 608. In the opening of the partition 609, the first electrode 101 is partially exposed, and the first electrode 101, an electroluminescent layer 605, and a second electrode 102 are stacked in this order in the opening. It is to be noted that the electroluminescent layer 605 in the present embodiment indicates the first layer 111 to the third layer 113, and additionally the fourth layer 128 of in the embodiment described above. In other words, the electroluminescent layer 605 indicates the layers between the first electrode 101 and the second electrode 102.

The interlayer insulating film 608 can be formed by an organic resin film, an inorganic insulating film, or an insulating film containing a Si—O—Si bond formed by a siloxane based material as a starting material (hereinafter referred to as a "siloxane insulating film"). It is to be noted that siloxane has a skeleton structure formed by the bond of silicon (Si) and oxygen (O), in which an organic group containing at least hydrogen (such as an alkyl group or aromatic hydrocarbon) is used as a substitutent. Alternatively, a fluoro group may be used as the substitutent. Further, an organic group containing at least hydrogen and a fluoro group may also be used as substitutents. The interlayer insulating film 608 may also be formed by using a so-called low dielectric constant material (low-k material). The interlayer insulating film 608 may be either a single layer or a lamination layer.

The partition 609 can be formed by an organic resin film, an inorganic insulating film, or a siloxane insulating film. In the case of using an organic resin film, for example, acrylic, polyimide, or polyamide can be used. In the case of using an inorganic insulating film, silicon oxide, silicon nitride oxide, or the like can be used. The partition 609 is formed by a photosensitive organic resin film and has an opening on the first electrode 101, which is formed such that the side face thereof has a slope with a continuous curvature, thereby preventing the first electrode 101 and the second electrode 102 from being connected to each other. Further, the partition 609 may be either a single layer or a lamination layer.

In FIG. 4A, in order to extract light to the first electrode 101 side, the first electrode 101 is formed by using a material or to have film a thickness enough to transmit light. Further, the first electrode 101 is formed by a material that is suitable for being used as an anode. Moreover, in addition to the light-transmitting material mentioned above, the first electrode 101 may be formed by using, for example, a single-layer film composed of one or more of TiN, ZrN, Ti, W, Ni, Pt, Cr, Ag, Al and the like, a lamination layer of a titanium nitride film and a film containing aluminum as a main component, or a three-layer structure of a titanium nitride film, a film including aluminum as a main component and a titanium nitride film. However, when a material except for the light-transmitting material is used, the first electrode 101 is formed with a thickness enough to transmit light (preferably, about 5 nm to 30 nm).

The second electrode 102 is formed by a material that reflects or blocks light and with a thickness enough to reflect or block light. Further, the second electrode 102 is formed by a material that is suitable for being used as a cathode. That is, a metal, an alloy, an electrically conductive compound having a low work function, or a mixture thereof can be used to form the second electrode 102. Specifically, an alkali metal such as Li and Cs, an alkaline earth metal such as Mg, Ca and Sr, an alloy containing such metals (Mg:Ag, Al:Li, Mg:In, or the like), a compound of such metals (calcium fluoride or calcium nitride), or a rare-earth metal such as Yb and Er can be used.

The electroluminescent layer 605 is composed of a signal layer or a plurality of layers. Although the embodiments described above show the figures (refer to FIGS. 1 and 2) in which the interface between the layers is clear, it is not always necessary to be clear. The materials forming the respective layers may be partially mixed to make the interface unclear.

In the case of the pixel shown in FIG. 4A, light emitted from the light emitting element 603 can be extracted from the first electrode 101 side as indicated by a hollow arrow.

FIG. 4B is a cross-sectional view of a pixel where a TFT 601 is a p-type and light emitted from a light emitting element 603 is extracted from a second electrode 102 side. In FIG. 4B, a first electrode 101 of the light emitting element 603 is electrically connected to the TFT 601. Further, on the first electrode 101, an electroluminescent layer 605 and the second electrode 102 are stacked in this order.

The first electrode 101 is formed by a material that reflects or blocks light and to have a film thickness enough to reflect or block light. The first electrode 101 formed by a material that is suitable for being used as an anode. For, example, the first electrode 101 may be formed by a single-layer film of one or more of TiN, ZrN, Ti, W, Ni, Pt, Cr, Ag, Al and the like, a lamination layer of a titanium nitride film and a film containing aluminum as a main component, or a three-layer structure of a titanium nitride film, a film containing aluminum as its main component and a titanium nitride film.

The second electrode 102 is formed by using a light-transmitting material or to have a film thickness enough to transmit light. Further, the second electrode 102 can be formed by a metal, an alloy, an electrically conductive compound each having a low work function or a mixture thereof. Specifically, an alkali metal such as Li and Cs, an alkaline earth metal such as Mg, Ca and Sr, an alloy containing such metals (Mg:Ag, Al:Li, Mg:In, or the like), and a compound of such metals (calcium fluoride or calcium nitride), or a rare-earth metal such as Yb and Er can be used. Then, the second electrode 102 is formed to have a thickness enough to transmit light (preferably, about 5 nm to 30 nm). It is to be noted that a light transmitting conductive oxide material such as indium tin oxide (ITO), zinc oxide (ZnO), indium zinc oxide (IZO), and zinc oxide doped with gallium (GZO) can also be used. Alternatively, zinc oxide containing silicon oxide, indium tin oxide containing silicon oxide (ITSO), or ITSO mixed with zinc oxide (ZnO) may be used.

The electroluminescent layer 605 can be formed similarly to the electroluminescent layer 605 in FIG. 4A.

In the case of the pixel shown in FIG. 4B, light emitted from the light emitting element 603 can be extracted from the second electrode 102 side as indicated by a hollow arrow.

FIG. 4C is a cross-sectional view of a pixel where a TFT 601 is a p-type and light emitted from the light emitting element 603 is extracted from both a first electrode 101 side and the second electrode 102 side. In FIG. 4C, the first electrode 101 in the light emitting element 603 is electrically connected to the TFT 601. In addition, over the first electrode 101, an electroluminescent layer 605 and the second electrode 102 are stacked in this order.

The first electrode 101 can be formed similarly to the first electrode 101 shown in FIG. 4A. The second electrode 102 can be formed similarly to the second electrode 102 shown in FIG. 4B. The electroluminescent layer 605 can be formed similarly to the electroluminescent layer 605 shown in FIG. 4A.

In the case of the pixel shown in FIG. 4C, light emitted from the light emitting element 603 can be extracted from both the first electrode 101 side and the second electrode 102 side as indicated by hollow arrows.

It is to be noted that the pixel structure according to the present invention is not limited to this. For example, an n-type TFT can be used for the semiconductor element for controlling current to the light emitting element 603. In this case, it is preferable that the first electrode 101 function as a cathode and the second electrode 102 function as an anode.

Further, the connecting structure of the first electrode 101 and a wiring of the TFT 601 is not limited to FIGS. 4A to 4C. For example, the wiring in the TFT 601 may be formed after forming the first electrode 101. Furthermore, the first electrode 101 and the wiring of the TFT 601 can be formed at the same time.

The present embodiment can be freely combined with the embodiments described above.

Embodiment 6

In the present embodiment, a cross-sectional structure of a panel for performing full color display, in which a color filter, a color conversion layer, and the like are provided will be described.

Figure 5:
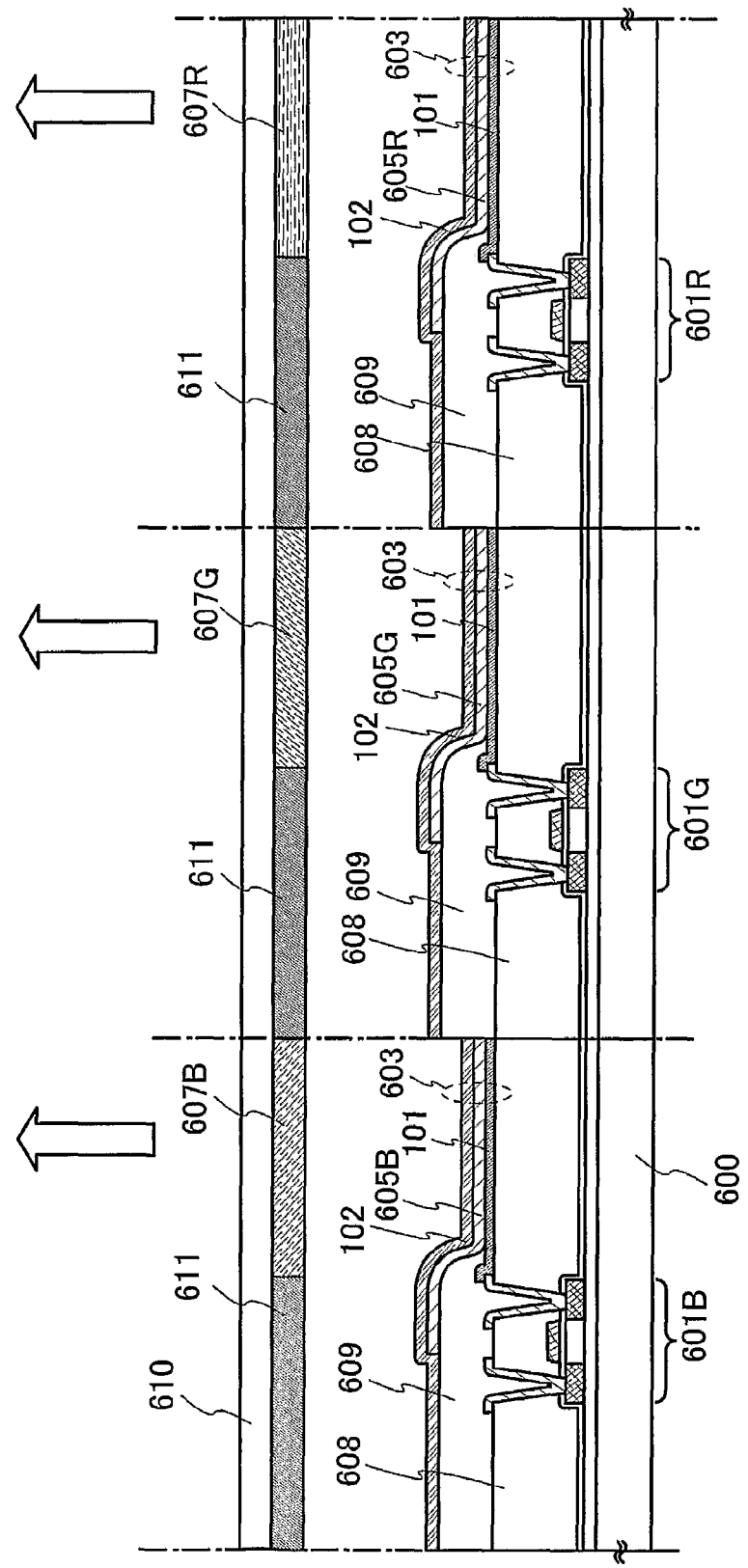
FIG. 5 is a cross-sectional view illustrating pixels according to the present invention.

As shown in FIG. 5, a pixel exhibiting red or reddish luminescence (R), a pixel exhibiting green or greenish luminescence (G), and a pixel exhibiting blue or bluish luminescence (B) can respectively be formed in accordance with the pixel structure shown in the embodiment described above in order to perform full color display. It is to be noted that semiconductor elements of the pixels are denoted by respectively 601R, 601G, and 601B, and electroluminescent layers thereof are denoted by 605R, 605G and 605B, respectively, in FIG. 5.

Next, sealing is performed with the use of an opposed substrate 610. Then, a space is formed between the opposed substrate 601 and a substrate 600. The space can be filled with an inert gas such as nitrogen or a resin. Accordingly, penetration of oxygen and moisture into the electroluminescent layers can be prevented. In addition, penetration of oxygen and moisture may be prevented by arranging a drying agent appropriately. Further, a spacer for keeping the space between the opposed substrate 601 and the substrate 600 may be arranged, and the spacer may have a function as a drying agent.

On the opposed substrate 610, 607R, 607G, and 607B as color filters or color conversion layers are respectively provided in regions opposed to the electroluminescent layers 605R, 605G and 605B. Further, in regions opposed to the TFTs 601R, 601G, and 601B, a resin 611 that functions as a black matrix is provided.

In this way, a light emitting device for extracting light from the opposed substrate 610 side can be formed. Luminescence can be extracted through the color filters or the like. Therefore, respective widths of luminescence spectra for RGB can be controlled, and a light emitting device that performs clear display can be provided.

Although materials exhibiting luminescence for each of RGB are used for the electroluminescent layers in the present embodiment, materials are not limited to these. For example, the above-described material exhibiting white luminescence may be used to perform full color display.

Figure 6:
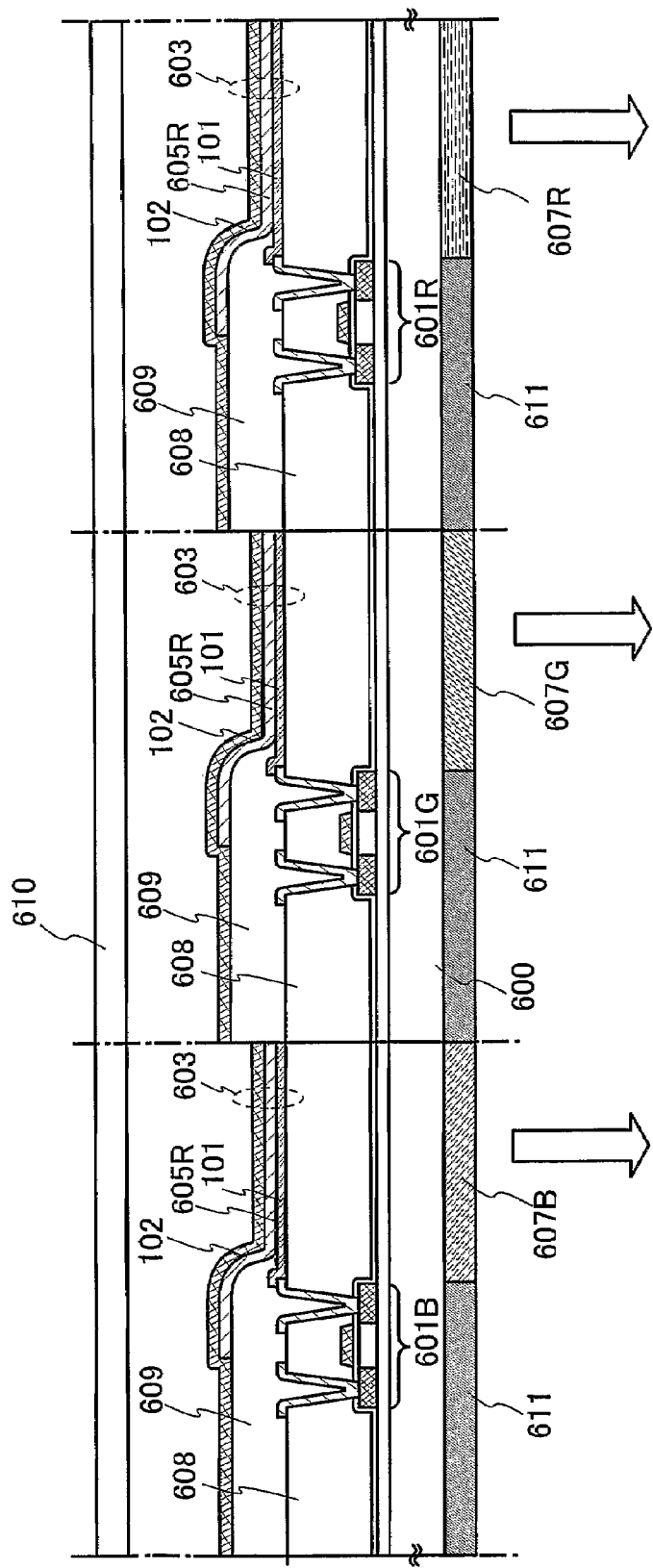
FIG. 6 is a cross-sectional view illustrating pixels according to the present invention.

FIG. 6 shows that a cross-sectional structure of a panel performing full color display in which a color filter, a color conversion layer and the like are provided on a substrate 600 side. The other structure is the same as FIG. 5, and the description thereof will be omitted.

In the case of the cross-sectional structure of the panel shown in FIG. 6, a light emitting device for extracting light from the substrate 600 side can be formed.

Similarly, when a light emitting element for extracting light from both the substrate 600 side and the opposed substrate 610 side is formed as shown in FIG. 4C, a color filter and the like may be provided on the substrate 600 side and the opposed substrate 610 side.

In this way, the present embodiment can freely be combined with any of the embodiments described above.

Embodiment 7

In the present embodiment, a pixel circuit used for the display device described above will be described.

Figure 7A:
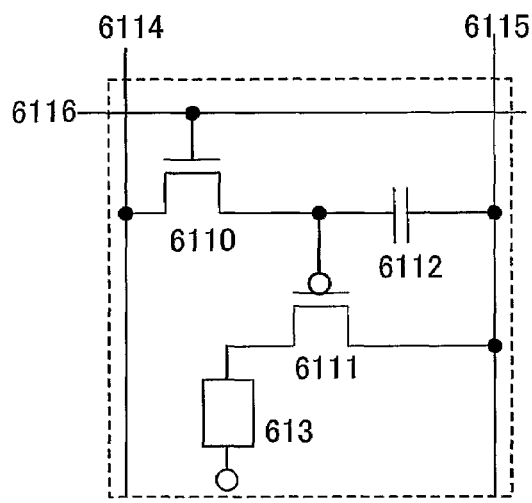
FIGS. 7A to 7C are diagrams illustrating equivalent circuits of pixels according to the present invention.

FIG. 7A is an example of an equivalent circuit diagram of a pixel, which includes a signal line 6114, a power supply line 6115, a scanning line 6116, and at an intersecting portion thereof, an light emitting element 613, transistors 6110 and 6111, and a capacitor 6112. For the light emitting element 613, the structure shown in the embodiment described above is used. A video signal is inputted into the signal line 6114 by a signal line driver circuit. The transistor 6110 can control supply of potential of the video signal to a gate of the transistor 6111 in accordance with a selection signal to be inputted into the scanning line 6116. The transistor 6111 is a driving transistor that can control supply of current to the light emitting element 613 in accordance with the potential of the video signal. The capacitor 6112 can hold voltage between gate and source of the transistor 6111. It is to be noted that although the capacitor 6112 is illustrated in FIG. 7A, it is not required to be provided if the gate capacitance of the transistor 6111 or the other parasitic capacitance is enough.

Figure 7B:
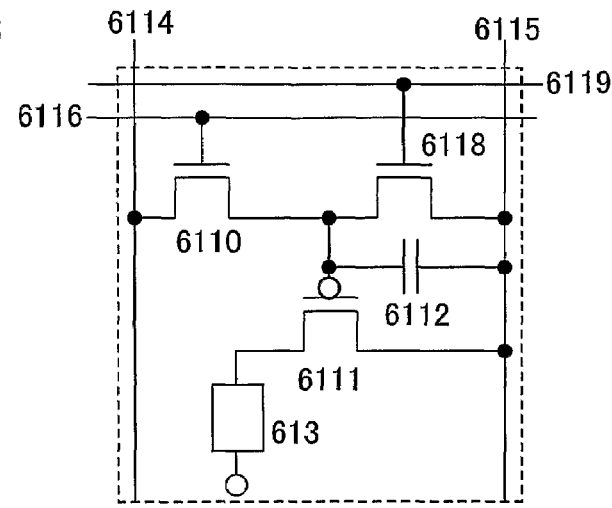

FIG. 7B is an equivalent circuit diagram of a pixel where a transistor 6118 and a scanning line 6119 are additionally provided to the pixel shown in FIG. 7A. By the transistor 6118, potential of the gate and the source of the transistor 6111 can be equal to each other so that the state in which no current flows into the light emitting element 613 is forcibly made. Therefore, the period for each subframe period can be set to be shorter than a period for inputting video signals into all pixels. Further, depending on the driving method, the state in which no current flows into the light emitting element 613 can be forcibly made even in a pixel shown in FIG. 7A.

Figure 7C:
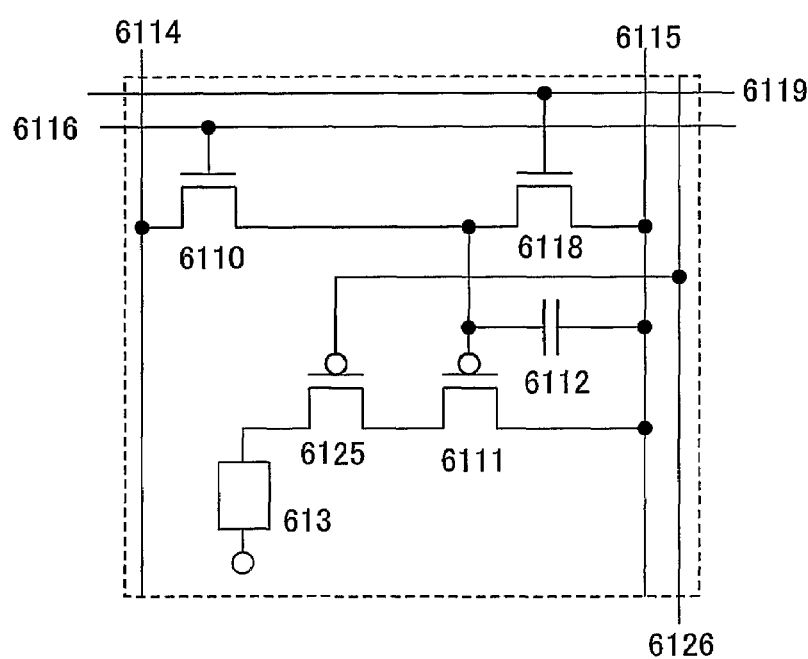

FIG. 7C is an equivalent circuit diagram of a pixel where a transistor 6125 and a wiring 6126 are additionally provided to the pixel shown in FIG. 7B. Gate potential of the transistor 6125 is fixed by the wiring 6126. In addition, the transistors 6111 and 6125 are connected in series between the power supply line 6115 and the light emitting element 613. Therefore, in FIG. 7C, the transistor 6125 controls the amount of current supplied to the light emitting element 613 whereas the transistor 6111 controls whether the current is supplied or not to the light emitting element 613.

It is to be noted that a pixel circuit according to the present invention is not limited to the structure shown in the present embodiment, and an analog gradation can be used besides a digital gradation. The present embodiment can be freely combined with the embodiments described above.

Embodiment 8

An electronic device that is provided with a light emitting element according to the present invention includes: a television set (simply referred to as a TV, or a television receiver), a digital camera, a digital video camera, a mobile phone set (simply referred to as a cellular phone set, or a cellular phone), a portable information terminal such as PDA, a portable game machine, a monitor for a computer, a computer, a sound reproducing device such as a car audio set, an image reproducing device provided with a recording medium such as a home game machine, and the like. Specific examples thereof will be described with reference to FIGS. 8A to 8F.

Figure 8A:
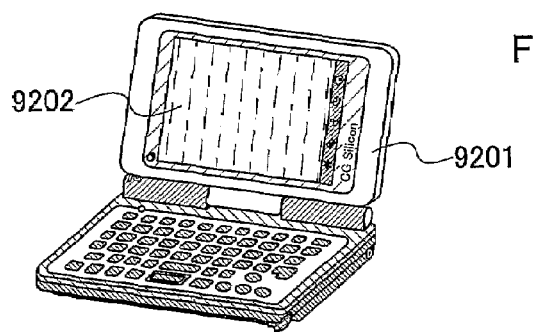
FIGS. 8A to 8F are diagrams illustrating electronic devices according to the present invention.

A portable information terminal device shown in FIG. 8A includes a main body 9201, a display portion 9202, and the like. The light emitting device according to the present invention can be applied to the display portion 9202. Accordingly, it is possible to provide a portable information terminal device in which a light emitting element can be made thicker and lower power consumption can be achieved without increasing the driving voltage.

Figure 8B:
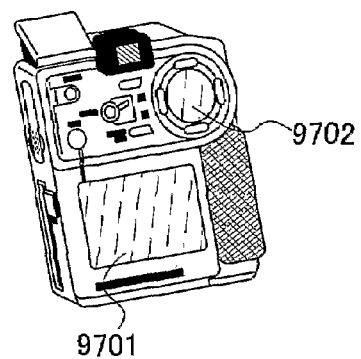

A digital video camera shown in FIG. 8B includes a display portion 9701, a display portion 9702, and the like. The light emitting device according to the present invention can be applied to the display portion 9701. Accordingly, it is possible to provide a digital video camera in which a light emitting element can be made thicker and lower power consumption can be achieved without increasing the driving voltage.

Figure 8C:
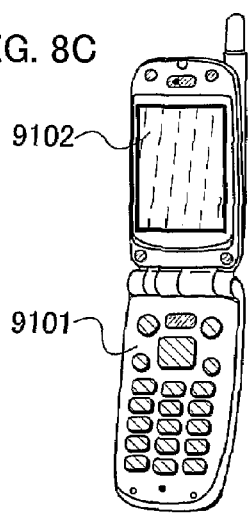

A cellular phone shown in FIG. 8C includes a main body 9101, a display portion 9102, and the like. The light emitting device according to the present invention can be applied to the display portion 9102. Accordingly, it is possible to provide a cellular phone in which a light emitting element can be made thicker and lower power consumption can be achieved without increasing the driving voltage.

Figure 8D:
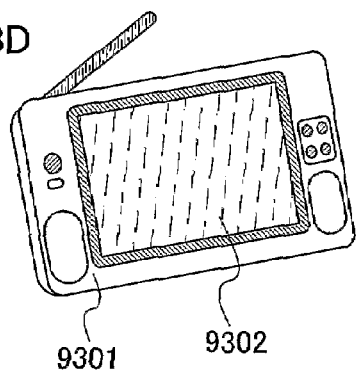

A portable television set shown in FIG. 8D includes a main body 9301, a display portion 9302, and the like. The light emitting device according to the present invention can be applied to the display portion 9302. Accordingly, it is possible to provide a portable television set in which a light emitting element can be made thicker and lower power consumption can be achieved without increasing the driving voltage. Further, the light emitting device according to the present invention can be applied to various types of television sets such as a small-sized television incorporated in a portable terminal such as a cellular phone machine, a medium-sized television which is portable, and a large-sized television (for example, 40 inches in size or more).

Figure 8E:
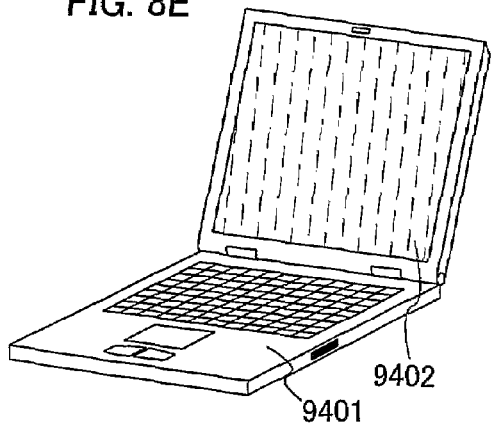

A portable computer shown in FIG. 8E includes a main body 9401, a display portion 9402, and the like. The light emitting device according to the present invention can be applied to the display portion 9402. Accordingly, it is possible to provide a portable computer in which a light emitting element can be made thicker and lower power consumption can be achieved without increasing the driving voltage.

Figure 8F:
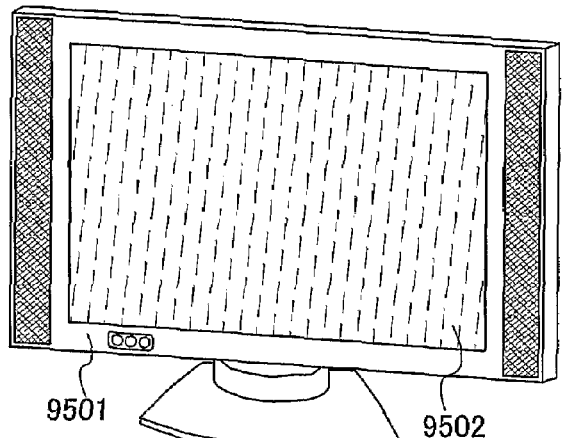

A television set shown in FIG. 8F includes a main body 9501, a display portion 9502, and the like. The light emitting device according to the present invention can applied to the display portion 9502. Accordingly, it is possible to provide a television set in which a light emitting element can be made thicker and lower power consumption can be achieved without increasing the driving voltage.

Therefore, it is possible to provide an electronic device in which a light emitting element can be made thicker and lower power driving voltage can be achieved without increasing the driving voltage in accordance with the present invention.

EXAMPLES

Synthesis Example 1

A synthesis method of 2,4,6-tris(acridone-N-yl)-1,3,5-triazine will be described.

Acridone (10.0 g, 54.6 mmol) was added gradually into a dried THF (tetrahydrofuran) suspension (200 mL) of sodium hydride (60% in oil, 2.4 g, 60 mmol) under cooling in ice. The suspension was stirred at a room temperature for 30 minutes, and a dried THF solution (50 mL) of cyanuric chloride (2.50 g. 13.8 mmol) was dropped into the solution. After stirring at a room temperature for 12 hours, reflux for 6 hours was performed by heating. Then, approximately 100 mL of ethanol was added into a reaction mixture, and a precipitated solid was filtered. The obtained solid is dissolved in warm chloroform, and celite filtration was performed. The filtrate was concentrated to perform recrystallization, and a pale yellow compound was obtained at a yield of 77%.

Measurement of the obtained compound by NMR (nuclear magnetic resonance) could confirm that the obtained compound was 1,3,5-tris(acridone-N-yl)triazine represented by a structural formula (66).

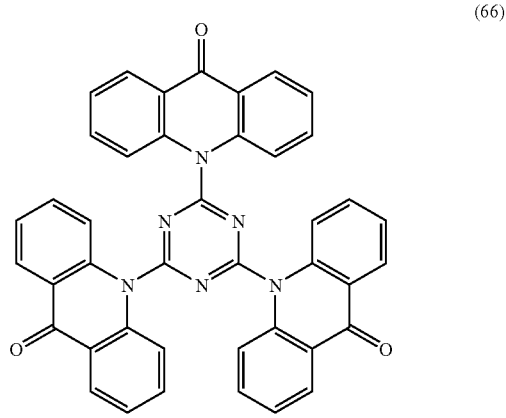

(66)

The NMR (nuclear magnetic resonance) spectrum data are shown as follows.

$^1$H NMR (300 MHz, CDCl$_3$) δ 7.37-7.51 (m, 12H), 7.67 (d, 6H, J=8.4 Hz), 8.35 (dd, 6H, J=1.8, 7.8 Hz). $^{13}$C NMR (75.5 MHz, CDCl$_3$) δ 121.8, 124.9, 126.1, 127.1, 132.6, 136.4, 140.5, 179.7.

Further, the obtained compound was measured with a melting point apparatus (manufactured by As One Corporation, ATM-01) to find that the melting point was exceeding 300° C. or more.

In addition, the obtained compound was deposited by an evaporation method. Then, when an ionization potential thereof in a thin film state was measured with a photoelectron spectrometer (manufactured by Riken Keiki Co., Ltd, AC-2), the ionization potential was −5.6 eV. When an absorption spectrum thereof in a thin film state was measured with an UV/VIS spectrometer (manufactured by JASCO Corporation, V-550), an energy level of an absorption edge on the longer wavelength side of the absorption spectrum was 3.0 eV. It was determined that a HOMO level and a LUMO level of a substance represented by the structural formula (66) are −5.6 eV and −2.6 eV, respectively, and an energy gap between the HOMO level and the LUMO level is 3.0 eV.

Synthesis Example 2

A synthesis method of 2,4,6-tris(10-phenyl-dihydrophenazine-5-yl)-1,3,5-triazine is described.

In a nitrogen atmosphere, phenyllithium (2.0M dibutylether solution, 53.0 mmol) was dropped into a dried toluene solution (180 mL) of phenazine (10.1 g, 56.0 mmol) at a room temperature. After drying at a room temperature for 12 hours, a dried THF solution (50 mL) of cyanuric chloride (2.40 g. 13.2 mmol) was dropped into the solution. Reflux for 6 hours was performed to a reaction mixture by heating, and water was added to perform extraction with toluene. It is to be noted that an insoluble object that is precipitated during the extraction was removed by filtration. A toluene layer washed with saturated aqueous solution, and then, drying, filtration, and concentration with magnesium sulfate were performed. Approximately 300 mL of ether was added to the obtained solid to obtain an ether insoluble part by filtration. The solid was purified by recrystallization (twice) with chloroform/ethanol, and then, a light brown compound was obtained (yield of 45%).

Measurement of the obtained compound by NMR (nuclear magnetic resonance) could confirm that the obtained compound was a substance (2,4,6-tris(10-phenyl-dihydrophenazine-5-yl)-1,3,5-triazine) represented by a structural formula (67).

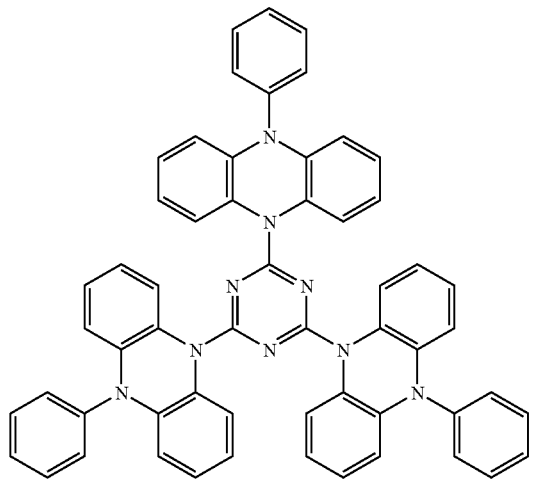

(67)

The NMR (nuclear magnetic resonance) spectrum data are shown as follows.

$^1$H NMR (300 MHz, CDCl$_3$) δ 6.25 (dd, 6H, J=1.5, 8.4 Hz), 6.77-6.86 (m, 12H), 7.36-7.58 (m, 21H).

The invention claimed is:

1. A light emitting element comprising:
a pair of electrodes, and
a layer between the pair of electrodes, the layer containing both a metal oxide and a triazine derivative represented by a general formula (1),

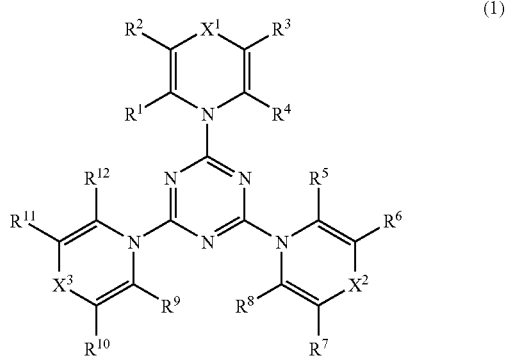

(1)

wherein:

$R^1$ to $R^{12}$ are independent, or at least one of $R^1$ and $R^2$, $R^3$ and $R^4$, $R^5$ and $R^6$, $R^7$ and $R^8$, $R^9$ and $R^{10}$, and $R^{11}$ and $R^{12}$ is bonded to form a ring selected from an aromatic ring, a heterocycle, and an alicycle which we unsubstituted or have an alkyl group having 1 to 6 carbon atoms; and when $R^1$ to $R^{12}$ are independent, $R^1$ to $R^{12}$ are individually any one of hydrogen, an alky group having 1 to 6 carbon atoms, an alkoxy group having 1 to 6 carbon atoms, an halogen group, an acyl group having 1 to 6 carbon atoms, an alkoxycarbonyl group having 1 to 6 carbon atoms, an aryl group having 6 to 30 carbon atoms, and a heteroaromatic group having 2 to 18 carbon atoms, and wherein:

$X^1$, $X^2$, and $X^3$ indicate any group of formulas (2) to (7)

(2)

(3)

(4)

(5)

(6)

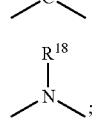

(7)

$R^{13}$ and $R^{14}$ are independent or bonded to each other to form an alicycle having 3 to 10 carbon atoms;
  when $R^{13}$ and $R^{14}$ are independent, $R^{13}$ and $R^{14}$ are selected from hydrogen, an alkyl group having 1 to 6 carbon atoms, an aryl group having 6 to 30 carbon atoms, and a heteroaromatic group having 2 to 18 carbon atoms;
$R^{15}$ is any one of hydrogen, an unsubstituted aryl group having 6 to 30 carbon atoms, and an aryl group having 6 to 30 carbon atoms which is substituted by a substitutent selected from an alkyl group having 1 to 6 carbon atom, an acyl group having 1 to 6 carbon atoms, a halogen group, and a heteroaromatic group having 2 to 18 carbon atoms;
  $R^{16}$ and $R^{17}$ are selected from hydrogen, an unsubstituted aryl group having 6 to 30 carbon atoms, and an aryl group having 6 to 30 carbon atoms which is substituted by a substituent selected from an alkvl group having 1 to 6 carbon atoms, a halogen group, an aryl group having 6 to 30 carbon atoms, a heteroaromatic group having 2 to 18 carbon atoms, and a cyano group; and
$R^{18}$ is any one of hydrogen, an alkyl group having 1 to 6 carbon atoms, an unsubstituted aryl group having 6 to 30 carbon atoms, an aryl group having 6 to 30 carbon atoms which is substituted by a dialkylamino group, and a heteroaromatic group having 2 to 18 carbon atoms.

2. A light emitting element according to claim 1, wherein the metal oxide is a molybdenum oxide, a vanadium oxide, a titanium oxide, a lithium oxide, or a rhenium oxide.

3. A light emitting element according to claim 1, wherein the light emitting element includes a luminescent material having an emission wavelength in the bandwidth from 400 to 500 nm between the pair of the electrodes.

4. A light emitting device comprising:
a semiconductor layer;
a pair of electrodes provided over the semiconductor layer; and
a first layer, a second layer, and a third layer provided in this order between the pair of the electrodes,
wherein any one of the first layer to the third layer has a layer containing both a metal oxide and a triazine derivative represented by the general formula (1),

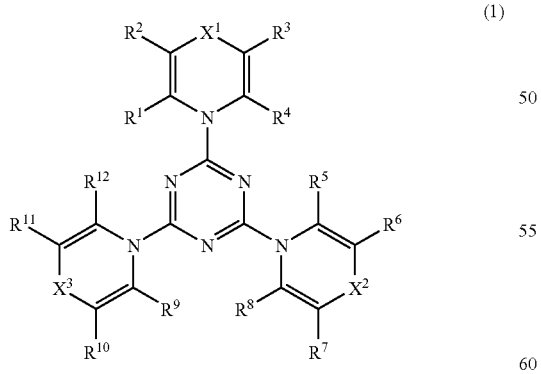

(1)

$R^1$ to $R^{12}$ are independent, or at least one of $R^1$ and $R^2$, $R^3$ and $R^4$, $R^5$ and $R^6$, $R^7$ and $R^8$, $R^9$ and $R^{10}$, $R^{11}$ and $R^{12}$ is bonded to form a ring selected from an aromatic ring, a heterocycle, and an alicycle which are unsubstituted or have an alkyl group having 1 to 6 carbon atoms; and when $R^1$ to $R^{12}$ are independent, $R^1$ to $R^{12}$ are individually any one of hydrogen, an alkyl group having 1 to 6 carbon atoms, an alkoxy group having 1 to 6 carbon atoms, a halogen group, an acyl group having 1 to 6 carbon atoms, an alkoxycarbonyl group having 1 to 6 carbon atoms, an aryl group having 6 to 30 carbon atoms, and a heteroaromatic group having 2 to 18 carbon atoms, and
wherein:
  $X^1$, $X^2$, and $X^3$ indicate individually any group of formulas (2) to (7)

(2)

(3)

(4)

(5)

(6)

(7)

$R^{13}$ and $R^{14}$ are independent or bonded to each other to form an alicycle having 3 to 10 carbon atoms;
  when $R^{13}$ and $R^{14}$ are independent, $R^{13}$ and $R^{14}$ are selected from hydrogen, an alkyl group having 1 to 6 carbon atoms, an aryl group having 6 to 30 carbon atoms, and a heteroaromatic group having 2 to 18 carbon atoms;
$R^{15}$ is any one of hydrogen, an unsubstituted aryl group having 6 to 30 carbon atoms, and an aryl group having 6 to 30 carbon atoms which is substituted by a substitutent selected from an alkyl group having 1 to 6 carbon atom, an acyl group having 1 to 6 carbon atoms, a halogen group, and a heteroaromatic group having 2 to 18 carbon atoms;
  $R^{16}$ and $R^{17}$ are selected from hydrogen, an unsubstituted aryl group having 6 to 30 carbon atoms, and an aryl group having 6 to 30 carbon atoms which is substituted b a substituent selected from an alkyl group having 1 to 6 carbon atoms, a halogen group, an aryl group having 6 to 30 carbon atoms, a heteroaromatic group having 2 to 18 carbon atoms, and a cyano group; and
$R^{18}$ is any one of hydrogen, an alkyl group having 1 to 6 carbon atoms, an unsubstituted aryl group having 6 to 30 carbon atoms, an aryl group having 6 to 30 carbon atoms which is substituted by a dialhylamino group, and a heteroaromatic group having 2 to 18 carbon atoms.

5. A light emitting device according to claim 4, wherein the metal oxide is a molybdenum oxide, a vanadium oxide, a titanium oxide, a lithium oxide, or a rhenium oxide.

6. A light emitting device according to claim 4, wherein the light emitting element includes a luminescent material having an emission wavelength in the bandwidth from 400 to 500 nm between the pair of the electrodes.

7. A light emitting element according to claim 1, wherein the layer containing the triazine derivative and the metal oxide is in contact with one of the pair of electrodes.

8. A light emitting device according to claim 4, wherein the one of the first layer to the third layer is in contact with one of the pair of electrodes.

* * * * *

UNITED STATES PATENT AND TRADEMARK OFFICE
CERTIFICATE OF CORRECTION

PATENT NO. : 7,732,061 B2
APPLICATION NO. : 10/590568
DATED : June 8, 2010
INVENTOR(S) : Ryoji Nomura et al.

It is certified that error appears in the above-identified patent and that said Letters Patent is hereby corrected as shown below:

Column 2, Line 34, Change "substitutent" to -- substituent --;

Column 2, Line 37, Change "substitutent" to -- substituent --;

Column 3, Line 23, Change "substitutent" to -- substituent --;

Column 3, Line 49, Change "substitutents" to -- substituents --;

Column 4, Line 4, Change "substitutents" to -- substituents --;

Column 4, Line 20, After "In the" Delete "a";

Column 4, Line 32, Change "substitutent" to -- substituent --;

Column 10, Line 51, Change "older" to -- order --;

Column 18, Line 19, Change "substitutent" to -- substituent--;

Column 19, Line 2, Change "substitutent" to -- substituent --;

Column 19, Line 10, Change "oxide" to -- oxygen --;

Column 19, Line 19, Change "substitutent" to -- substituent--;

Column 29, Line 50, Change "substitutent" to -- substituent --;

Column 29, Line 51, Change "substitutent" to -- substituent --;

Column 29, Line 53, Change "substitutents" to -- substituents --;

Signed and Sealed this
First Day of March, 2011

David J. Kappos
*Director of the United States Patent and Trademark Office*

CERTIFICATE OF CORRECTION (continued)
U.S. Pat. No. 7,732,061 B2

Column 35, Line 28, After "layer" Insert -- was --;

Column 36, Line 26, Change "we" to -- are --;

Column 36, Line 30, Change "alky" to -- alkyl --;

Column 36, Line 32, Change "an halogen" to -- a halogen --;

Column 37, Line 18, Change "alky" to -- alkyl --;

Column 37, Line 62, Insert -- wherein -- before "$R^1$";

Column 38, Line 58, After "substituted" Delete "b" and Insert -- by --;

Column 39, Line 66, Change "dialhylamino" to -- dialkylamino --.